(12) United States Patent
Noh et al.

(10) Patent No.: US 12,360,408 B2
(45) Date of Patent: Jul. 15, 2025

(54) PANEL REPAIRING DEVICE AND PANEL REPAIRING METHOD

(71) Applicant: SAMSUNG DISPLAY CO., LTD., Yongin-si (KR)

(72) Inventors: Kyungpyo Noh, Asan-si (KR); Jaeho Shin, Asan-si (KR); Ilok Jeong, Asan-si (KR); Taemin Choi, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 168 days.

(21) Appl. No.: 17/771,302

(22) PCT Filed: Aug. 31, 2020

(86) PCT No.: PCT/KR2020/011617
§ 371 (c)(1),
(2) Date: Apr. 22, 2022

(87) PCT Pub. No.: WO2021/085828
PCT Pub. Date: May 6, 2021

(65) Prior Publication Data
US 2022/0373830 A1    Nov. 24, 2022

(30) Foreign Application Priority Data

Oct. 29, 2019 (KR) .......................... 10-2019-0135829
Nov. 28, 2019 (KR) .......................... 10-2019-0155349

(51) Int. Cl.
*G02F 1/13* (2006.01)
(52) U.S. Cl.
CPC .................. *G02F 1/1309* (2013.01)

(58) Field of Classification Search
CPC ..................................................... G02F 1/1309
See application file for complete search history.

(56) References Cited

U.S. PATENT DOCUMENTS 6,386,682 B1 * 5/2002 Kimura ............... B41J 2/14314
347/54
6,693,699 B2    2/2004 Inoue et al.
(Continued)

FOREIGN PATENT DOCUMENTS

CN    1498753 A    5/2004
CN    1523380 A    8/2004
(Continued)

OTHER PUBLICATIONS

Extended European Search Report for Application No. 20881846.8-1020 dated Aug. 3, 2023 enumerating the above listed references.
(Continued)

*Primary Examiner* — Dah-Wei D. Yuan
*Assistant Examiner* — Kristen A Dagenais
(74) *Attorney, Agent, or Firm* — CANTOR COLBURN LLP

(57) ABSTRACT

A panel repairing method includes detecting a defective portion of a panel, providing primary ink, which is ejected from an ink ejection pin, onto a first portion of the defective portion, spreading the primary ink in a direction parallel to a plane defined on the panel, temporarily curing the primary ink, providing secondary ink, which is ejected from the ink ejection pin, onto a second portion of the defective portion disposed adjacent to the first portion, and curing the primary ink and the secondary ink.

18 Claims, 17 Drawing Sheets

(56) References Cited

U.S. PATENT DOCUMENTS

| | | | |
|---|---|---|---|
| 6,828,069 B1 | 12/2004 | Nakazawa et al. | |
| 7,101,013 B2 | 9/2006 | Nakamura | |
| 7,279,270 B2 | 10/2007 | Tanaka et al. | |
| 7,410,905 B2 | 8/2008 | Ushiyama et al. | |
| 8,395,747 B2 | 3/2013 | Yoshizawa et al. | |
| 9,375,733 B2 | 6/2016 | Chen | |
| 10,229,846 B2 | 3/2019 | Kikumoto | |
| 2003/0059949 A1* | 3/2003 | Gilbert | C12Q 1/00 422/504 |
| 2006/0159838 A1* | 7/2006 | Kowalski | H05K 3/1258 427/299 |
| 2008/0139075 A1* | 6/2008 | Birrell | B23K 26/351 445/2 |
| 2010/0003424 A1 | 1/2010 | Kim | |
| 2017/0111452 A1* | 4/2017 | Thazhathethil | H04L 67/125 |

FOREIGN PATENT DOCUMENTS

| | | | |
|---|---|---|---|
| CN | 101103306 A | | 1/2008 |
| CN | 103728779 A | | 4/2014 |
| CN | 105849871 A | | 8/2016 |
| CN | 106098966 A | | 11/2016 |
| CN | 106794477 A | | 5/2017 |
| CN | 110212001 A | | 9/2019 |
| JP | 2005300940 A | | 10/2005 |
| JP | 2005321795 A | | 11/2005 |
| JP | 200611244 A | | 1/2006 |
| JP | 2006350295 A | | 12/2006 |
| JP | 2009011244 A | * | 1/2009 |
| JP | 4464747 B2 | * | 5/2010 |
| KR | 20010007525 A | | 1/2001 |
| KR | 100522752 B1 | | 10/2005 |
| KR | 100667662 B1 | | 1/2007 |
| KR | 100909959 B1 | | 7/2009 |
| KR | 101155447 B1 | | 6/2012 |
| KR | 101280828 B1 | | 7/2013 |
| KR | 20130143420 A | | 12/2013 |
| KR | 101549672 B1 | | 9/2015 |
| KR | 101599040 B1 | | 3/2016 |
| KR | 1020190102864 A | | 9/2019 |

OTHER PUBLICATIONS

International Search Report mailed Nov. 27, 2020 for PCT/KR2020/011617, citing the above reference(s).

Written Opinion mailed Nov. 27, 2020 for PCT/KR2020/011617, citing the above reference(s).

* cited by examiner

PANEL REPAIRING DEVICE AND PANEL REPAIRING METHOD

TECHNICAL FIELD

Embodiments of the invention relate to a panel repairing apparatus and a panel repairing method.

BACKGROUND ART

Generally, display panels used in a display device include a first substrate, a second substrate facing the first substrate, and an image display layer disposed between the first substrate and the second substrate. The image display layer may include a liquid crystal layer, an electrowetting layer, an electrophoretic layer, or an organic light emitting layer.

When a display panel is manufactured, a mother panel, which includes the first and second substrates and the image display layer disposed between the first and second substrates, may be prepared. The mother panel may be cut into a plurality of unit panels. Each of the unit panels is used as the display panel. When a cutting process is performed on the mother panel, the outlines of the unit panels defined as cut portions may be damaged. The unit panel having the damaged outlines may be discarded.

DISCLOSURE OF THE INVENTION

Technical Problem

The purpose of embodiments of the invention is to provide a panel repairing apparatus and a panel repairing method capable of easily repairing a defective portion of a panel.

Technical Solution

A panel repairing method according to an embodiment of the invention includes: detecting a defective portion of a panel; providing primary ink, which is ejected from an ink ejection pin, onto a first portion of the defective portion; spreading the primary ink in a direction parallel to a plane defined on the panel; temporarily curing the primary ink; providing secondary ink, which is ejected from the ink ejection pin, onto a second portion of the defective portion disposed adjacent to the first portion; and curing the primary ink and the secondary ink.

A panel repairing method according to an embodiment of the invention includes: providing primary ink, which is ejected from an ink ejection pin, to a defective portion of a panel; bringing the ink ejection pin into contact with the primary ink; moving the ink ejection pin in a direction parallel to a plane defined on the panel to spread the primary ink; temporarily curing the primary ink; providing secondary ink, which is ejected from the ink ejection pin, to the defective portion; and curing the primary ink and the secondary ink.

A panel repairing apparatus according to an embodiment of the invention includes: a defect detection unit which detects a defective portion defined as a recessed portion at an edge of a panel; an ink ejection pin which ejects ink having black color; a control unit which moves the ink ejection pin above the defective portion according to position information of the defective portion provided from the defect detection unit; and a light radiation unit which emits light to the defective portion, where after primary ink ejected from the ink ejection pin is provided to the defective portion, the control unit moves the ink ejection pin in a downward direction in a way such that the ink ejection pin comes into contact with the primary ink, and moves the ink ejection pin in a direction parallel to a plane defined on the panel.

Advantageous Effects

A panel repairing apparatus and a panel preparing method according to an embodiment of the invention may enhance a yield of panels by easily repairing a defective portion formed on the outline of a panel.

MODE FOR CARRYING OUT THE INVENTION

Figure 1:
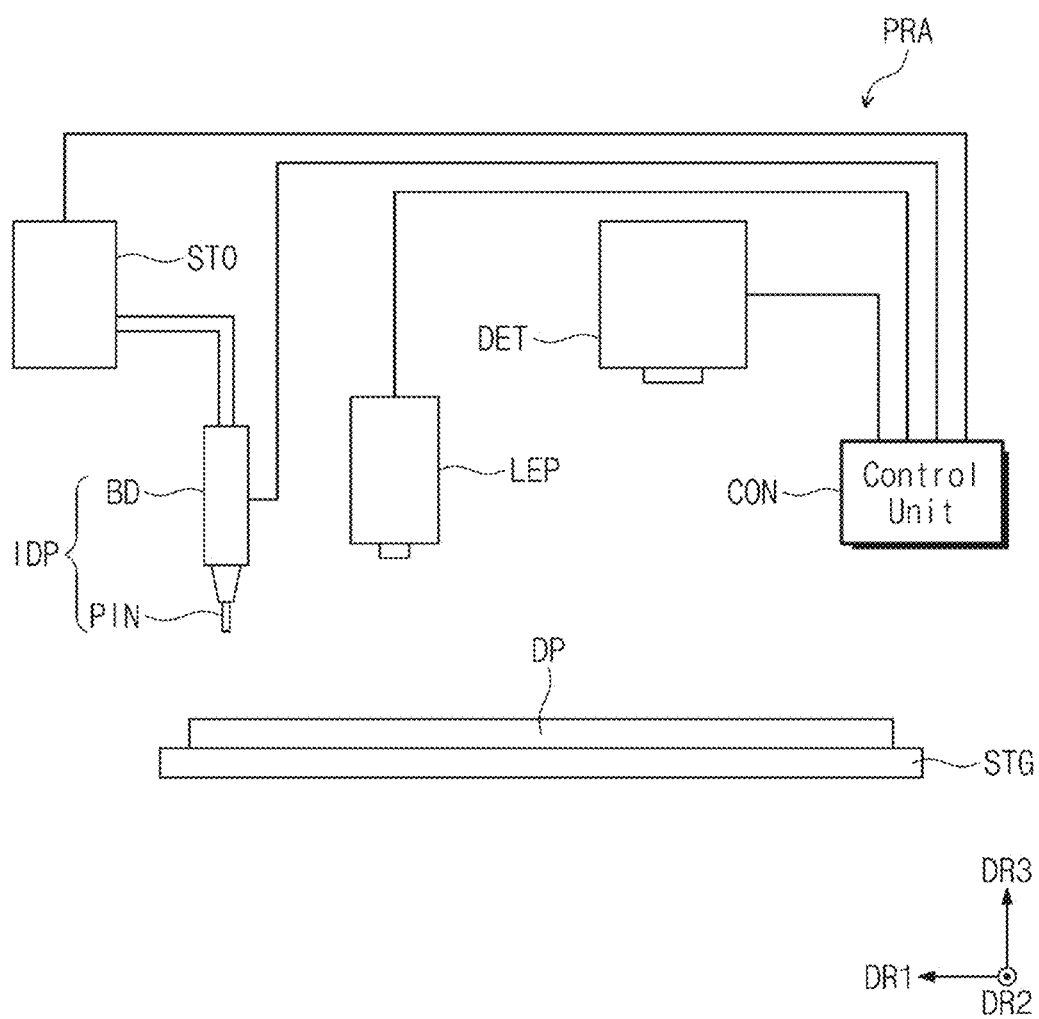
FIG. 1 is a view illustrating a panel repairing apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, it will be understood that when an element (or an region, a layer, a portion, or the like) is referred to as being "on", "connected to" or "coupled to" another element, it can be directly disposed on, connected or coupled to another element mentioned above, or intervening elements may be disposed therebetween.

Like numbers refer to like elements throughout. Also, in the drawings, the thicknesses, ratios, and dimensions of the elements are exaggerated for effective description of the technical contents.

"Or" means "and/or." The term "and/or" includes any and all combinations of one or more of the associated listed items.

Although the terms first, second, etc. may be used herein to describe various elements, these elements should not be limited by these terms. These terms are only used to distinguish one element from another element. For example, a first element may be referred to as a second element, and similarly, a second element may also be referred to as a first element without departing from the scope of the disclosure. The singular forms include the plural forms as well, unless the context clearly indicates otherwise.

Also, terms such as "below", "lower", "above", and "upper" may be used to describe the relationships of the components illustrated in the drawings. These terms have relative concepts and are described on the basis of the directions indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the disclosure belongs. Also, terms such as those defined in commonly used dictionaries should be interpreted as having a meaning that is consistent with their meaning in the context of the relevant art, and will not be interpreted in an idealized or overly formal sense unless expressly so defined herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a view illustrating a panel repairing apparatus according to an embodiment of the invention.

Referring to FIG. 1, a panel repairing apparatus PRA according to an embodiment of the invention may include a stage STG, an ink storage unit STO, an ink ejection unit IDP, a light radiation unit LEP, a defect detection unit DET, and a control unit CON.

A panel DP to be repaired may be disposed on the stage STG. The panel DP may have a surface on a plane defined by first and second directions DR1 and DR2. Hereinafter, a third direction DR3 is defined as a direction that perpendicularly crosses the plane defined by the first and the second directions DR1 and DR2, or a thickness direction the panel DP.

The panel DP may be defined as a display panel DP used in a display device. A mother panel is cut into a plurality of unit panels, and each of the unit panels may be used as the panel DP.

The ink storage unit STO, the ink ejection unit IDP, the light irradiation unit LEP, and the defect detection unit DET may be disposed above the panel DP. The control unit CON may control operations of the ink storage unit STO, the ink ejection unit IDP, the light radiation unit LEP, and the defect detection unit DET.

The defect detection unit DET may detect a defect of the display panel DP. The defect detection unit DET may capture an image of the panel DP, analyze the captured image, and detect a defect formed in the panel DP. In an embodiment, the defect detection unit DET may include a camera to detect the defect.

Hereinafter, a defect formed in the panel DP may be defined as a defective portion. In an embodiment, the defective portion may be formed on the outline of the panel DP. The defective portion may be defined as a recessed portion at the edge of the panel DP.

The defect detection unit DET may detect the position of the defective portion formed in the panel DP and transmit the detected position (or position information) of the defective portion to the control unit CON. The control unit CON may control movements of the ink ejection unit IDP and the light radiation unit LEP in response to the position information about the defective portion received from the defect detection unit DET. The ink ejection unit IDP and the light radiation unit LEP may be moved, by the control of the control unit CON, to the position where the defective portion is formed, and may be disposed above the defective portion.

The ink storage unit STO may store ink having a predetermined color. In an embodiment, the ink having black color may be stored in the ink storage unit STO. However, the embodiment is not limited thereto, and inks having another one of various colors may be stored in the ink storage unit STO. In an embodiment, red ink, green ink, blue ink, and black ink may be stored in the ink storage unit STO, for example. Although not illustrated, the ink storage unit STO may include a plurality of storage units that stores the red ink, the green ink, the blue ink, and the black ink, respectively.

The ink ejection unit IDP may be connected to the ink storage unit STO. The control unit CON may control the ink storage unit STO so that the ink stored in the ink storage unit STO is provided to the ink ejection unit IDP. Although not illustrated, a valve for controlling the supply of the ink may be disposed in the ink storage unit STO, and the valve may be connected to the ink ejection unit IDP. The control unit CON may control an opening/closing operation of the valve to control the supply of the ink.

The ink ejection unit IDP may eject the ink and provide the ejected ink to the defective portion. The control unit CON may control an amount of the ink ejected from the ink ejection unit IDP. The ink ejection unit IDP may include a body part BD and an ink ejection pin PIN. The body part BD may be connected to the ink storage unit STO and receive the ink from the ink storage unit STO. The ink ejection pin PIN may be connected to the body part BD and eject the ink received from the body part BD.

The ink ejection pin PIN may be used to spread the ink provided in the defective portion. In an embodiment, the control unit CON may control the operation of the ink ejection pin PIN so that the ink ejection pin PIN reciprocates in a direction parallel to an upper surface of the panel DP to spread the ink. The operation will be described in detail later.

After the ink is provided in the defective portion, the light radiation unit LEP may generate light and emit the light to the ink disposed in the defective portion. The ink may be cured by the light.

Figure 2:
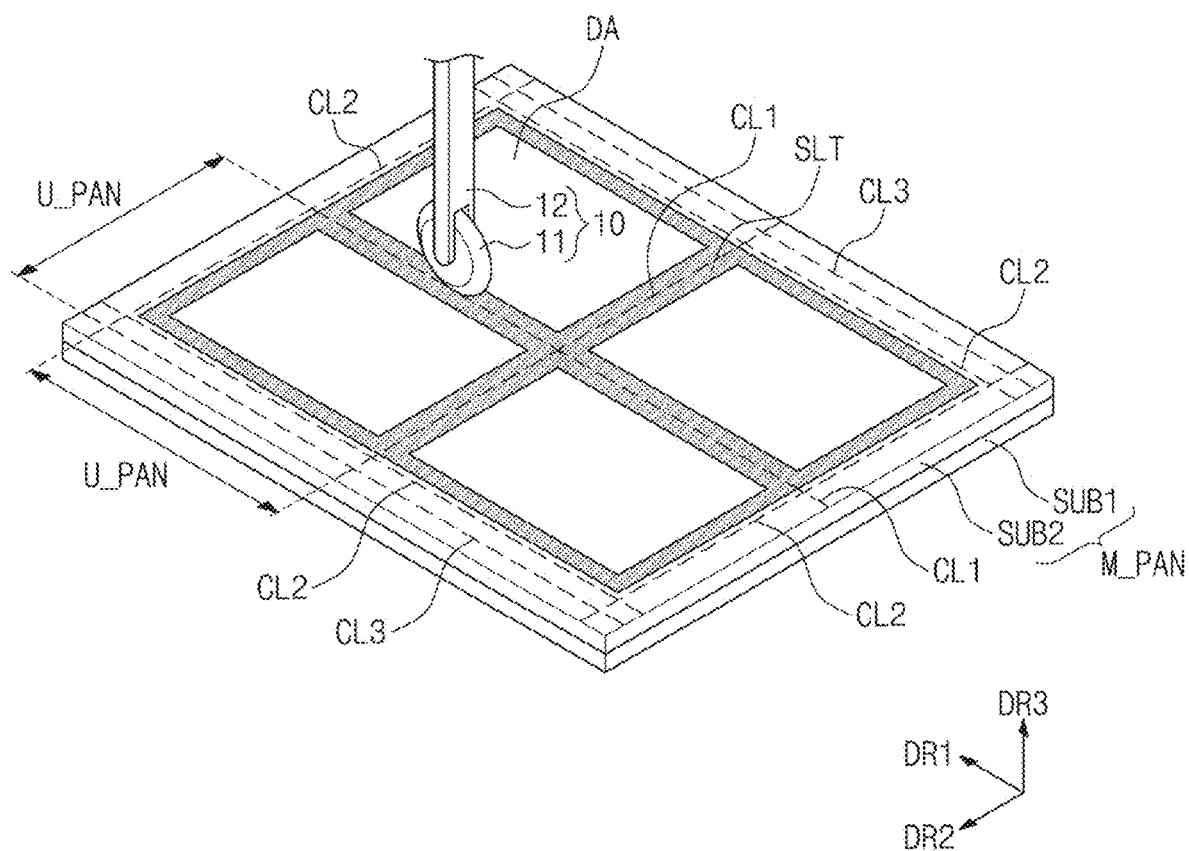
FIG. 2 is a view illustrating an embodiment of a mother panel.
Figure 3:
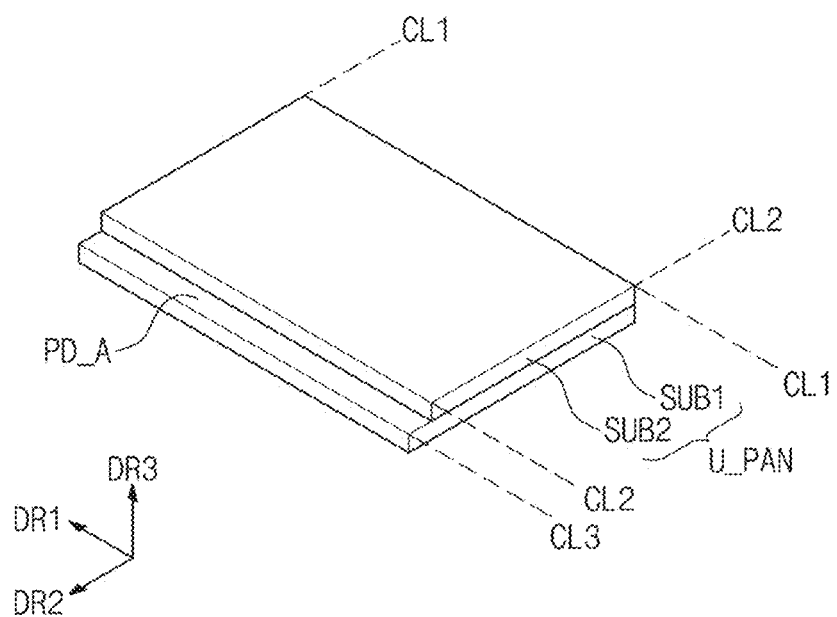
FIG. 3 is a view illustrating one unit panel of a plurality of unit panels formed by cutting the mother panel illustrated in FIG. 2.

FIG. 2 is a view illustrating an embodiment of a mother panel. FIG. 3 is a view illustrating one unit panel of a plurality of unit panels formed by cutting the mother panel illustrated in FIG. 2.

Referring to FIG. 2, an embodiment of a mother panel M_PAN may include a first substrate SUB1, a second substrate SUB2 facing the first substrate SUB1, and an image display layer (not shown) disposed between the first substrate SUB1 and the second substrate SUB2. The first substrate SUB1 and the second substrate SUB2 may include a glass substrate. The image display layer may be a liquid crystal layer, an electrowetting layer, an electrophoretic layer, or an organic light emitting layer. Hereinafter, for convenience of description, embodiments where the image display layer is a liquid crystal layer will be defined in detail.

The mother panel M_PAN may include a plurality of unit panels U_PAN. Each of the unit panels U_PAN may have a rectangular shape that have long sides extending in the first direction DR1 and short sides extending in the second direction DR2.

Each of the unit panels U_PAN may include a display region DA including a plurality of pixels (not shown) and an encapsulation layer SLT disposed to surround the display region DA. The encapsulation layer SLT may be substantially disposed between the first substrate SUB1 and the second substrate SUB2.

The mother panel M_PAN may be cut by a cutting unit 10 along a plurality of cutting lines CL1, CL2, and CL3 extending along boundaries (or boundary areas) of the unit panels U_PAN. The cutting unit 10 may include a wheel unit 11 and a wheel support part 12 supporting the wheel unit 11.

The cutting lines CL1, CL2, and CL3 may include a plurality of first cutting lines CL1, a plurality of second cutting lines CL2, and a plurality of third cutting lines CL3. The boundaries of the unit panels U_PAN between the display regions DA adjacent to each other may be shared. The first cutting lines CL1 may extend along common boundaries of the unit panels U_PAN.

The first cutting lines CL1 may be disposed at centers of the boundaries between the display regions DA adjacent to each other in the first direction DR1 and may extend in the second direction DR2. Also, the first cutting lines CL1 may be disposed at centers of the boundaries between the display regions DA adjacent to each other in the second direction DR2 and may extend in the first direction DR1.

The second cutting lines CL2 may extend along boundaries of the encapsulation layer SLT adjacent to the outlines of the mother panel M_PAN. The second cutting lines CL2 may extend in the first direction DR1 along the boundaries of the encapsulation layer SLT adjacent to the outlines of the mother panel M_PAN that extend in the first direction DR1. Also, the second cutting lines CL2 may extend in the second direction DR2 along the boundaries of the encapsulation layer SLT adjacent to the outlines of the mother panel M_PAN that extend in the second direction DR2.

The third cutting lines CL3 may extend in the first direction DR1. Each of the third cutting lines CL3 may extend in the first direction DR1 and may be disposed between the outline and the second cutting line CL2 of the mother panel M_PAN adjacent to each other in the second direction DR2. The third cutting lines CL3 may be disposed to one-to-one correspond to the second cutting lines CL2 that extend in the first direction DR1. Each of the third cutting lines CL3 may be spaced apart from the corresponding second cutting line CL2 in the second direction DR2.

The wheel unit 11 moves while rotating, and the mother panel M_PAN may be cut along the first, second, and third cutting lines CL1, CL2, and CL3. The mother panel M_PAN may be cut along the first, second, and third cutting lines CL1, CL2, and CL3 to form the unit panels U_PAN.

For instance, FIG. 3 illustrates a unit panel U_PAN disposed at a second row and a second column among the unit panels U_PAN illustrated in FIG. 2.

Referring to FIG. 3, the unit panel U_PAN may have a surface on a plane defined by the first and second directions DR1 and DR2. The unit panel U_PAN may include a first substrate SUB1, a second substrate SUB2 facing the first substrate SUB1, and a liquid crystal layer (not shown) disposed between the first substrate SUB1 and the second substrate SUB2.

Each of the first substrate SUB1 and the second substrate SUB2 may have a rectangular shape that has long sides extending in the first direction DR1 and short sides extending in the second direction DR2. The length of the first substrate SUB1 may be greater than that of the second substrate SUB2 with respect to the second direction DR2.

The long sides of the unit panel U_PAN may be formed by the cutting along the first, second, and third cutting lines CL1, CL2, and CL3 extending in the first direction DR1. The short sides of the unit panel U_PAN may be formed by the cutting along the first and second cutting lines CL1 and CL2 extending in the second direction DR2.

The long sides of the first substrate SUB1 of the unit panel U_PAN may be formed by the cutting along the first cutting line CL1 and the third cutting line CL3 extending in the first direction DR1. The long sides of the second substrate SUB2 of the unit panel U_PAN may be formed by the cutting along the first cutting line CL1 and the second cutting line CL2 extending in the first direction DR1. A region of the first substrate SUB1 between the second cutting line CL2 and the third cutting line CL3 extending in the first direction DR1 may be defined as a pad region PD_A.

The short sides of the first and second substrates SUB1 and SUB2 of the unit panel U_PAN may be formed by the cutting along the first and second cutting lines CL1 and CL2 extending in the second direction DR2.

The cutting sequence by the first, second, and third cutting lines CL1, CL2, and CL3 may be variously, e.g., diversely, set. Also, the first substrate SUB1 may be cut first along the first, second, and third cutting lines CL1, CL2, and CL3, or the second substrate SUB2 may be cut first.

In an embodiment, the first cutting lines CL1 may be cut earlier than the second and third cutting lines CL2 and CL3, or the second cutting lines CL2 may be cut earlier than the first and third cutting lines CL1 and CL3. The third cutting lines CL3 may be cut earlier than the first and second cutting lines CL1 and CL2. Also, the first substrate SUB1 may be cut earlier than the second substrate SUB2, or the second substrate SUB2 may be cut earlier than the first substrate SUB1.

According to the cutting sequence, the positions of the first substrate SUB1 and the second substrate SUB2 may change. When the first substrate SUB1 is cut first, the first substrate SUB1 may be disposed above the second substrate SUB2. When the second substrate SUB2 is cut first, the second substrate SUB2 may be disposed above the first substrate SUB1.

When the mother panel M_PAN is cut along the first, second, and third cutting lines CL1, CL2, and CL3, the outlines of the unit panel U_PAN may be damaged. The defective portion of the panel DP described above may be a recessed portion formed as a piece of the edge of the unit panel U_PAN comes out in the form of a segment. Particularly, this defective portion may be generated mainly in an edge of the first substrate SUB1 and an edge of the second substrate SUB2.

The defective portions formed in the first and second substrates SUB1 and SUB2 may be formed by the panel repairing apparatus PRA illustrated in FIG. 1. This operation will be described later in detail.

Figure 4:
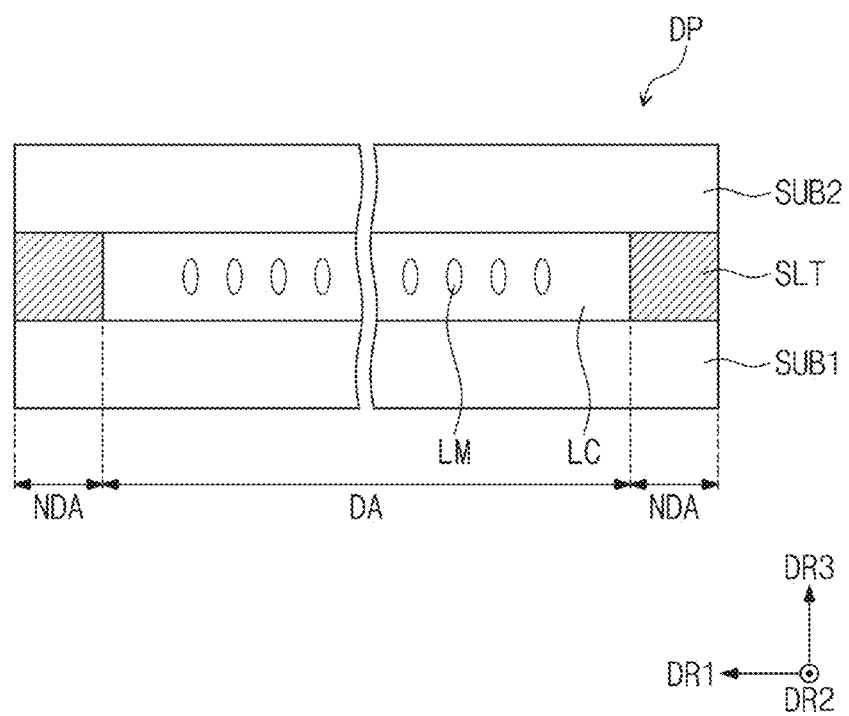
FIG. 4 is a view schematically illustrating a configuration of the cross-section of the unit panel illustrated in FIG. 3.
Figure 5:
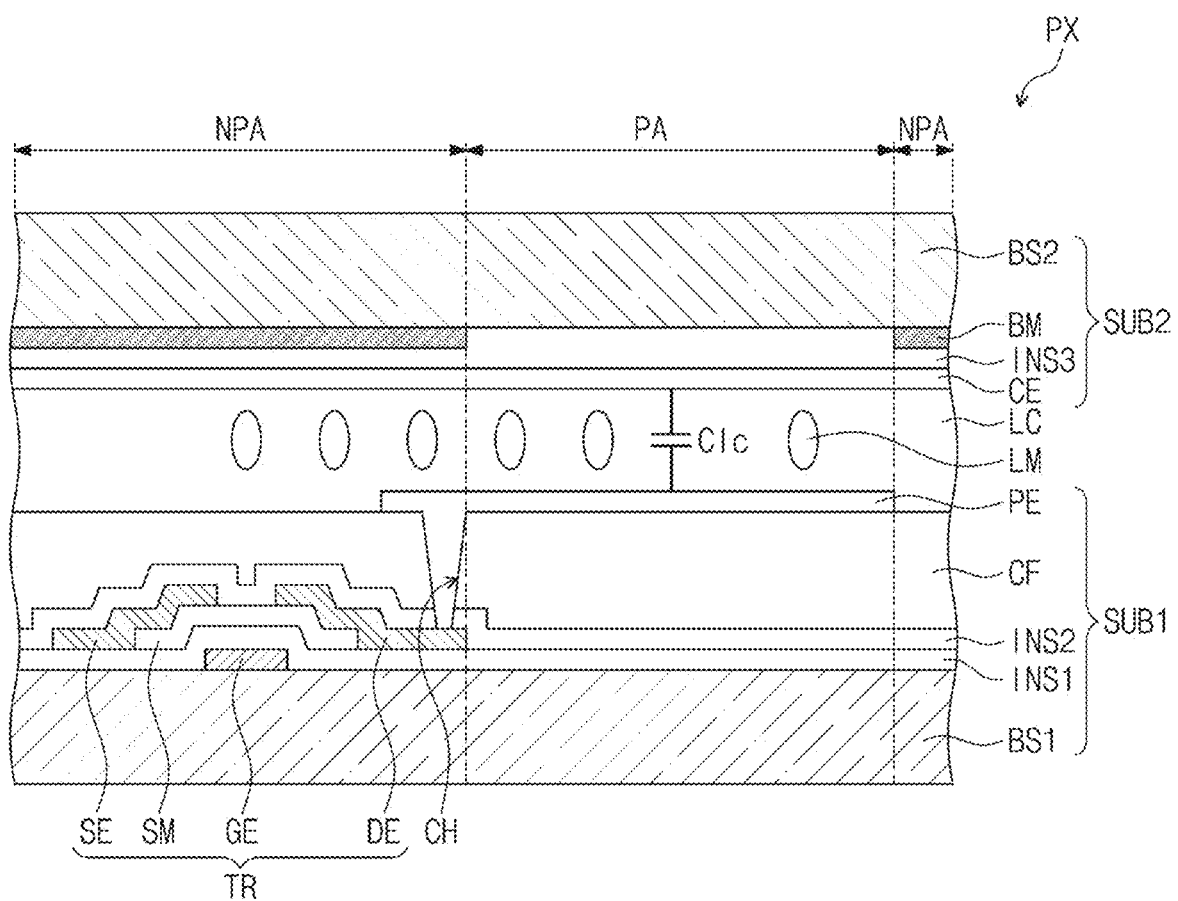
FIG. 5 is a view illustrating a configuration of the cross-section of one pixel disposed in a display region illustrated in FIG. 4.

FIG. 4 is a view schematically illustrating a configuration of the cross-section of the unit panel illustrated in FIG. 3. FIG. 5 is a view illustrating a configuration of the cross-section of one pixel disposed in a display region illustrated in FIG. 4.

Hereinafter, the unit panel U_PAN in FIG. 4 is referred to as a panel DP.

Referring to FIG. 4, when viewed in a plan view defined by the first and second directions DR1 and DR2, the planar region of the panel DP may include a display region DA and a non-display region NDA around the display region DA. The panel DP may include a first substrate SUB1, a second substrate SUB2 disposed on the first substrate SUB1, a liquid crystal layer LC disposed between the first substrate SUB1 and the second substrate SUB2, and an encapsulation layer SLT disposed between the first substrate SUB1 and the second substrate SUB2.

The encapsulation layer SLT may be disposed in the non-display region NDA. The first substrate SUB1 and the second substrate SUB2 may be adhered to each other by the encapsulation layer SLT. The liquid crystal layer LC may be sealed between the first substrate SUB1 and the second substrate SUB2 by the encapsulation layer SLT. The liquid crystal layer LC may include liquid crystal molecules LM.

Referring to FIGS. 4 and 5, pixels PX may be disposed in the display region DA. For instance, FIG. 5 illustrates one pixel PX, but substantially, a plurality of pixels PX may be disposed in the display region DA.

Referring to FIG. 5, the pixel PX may include a transistor TR disposed on a first base substrate BS1 and a liquid crystal capacitor Clc connected to the transistor TR. The liquid crystal capacitor Clc may include a pixel electrode PE, a common electrode CE disposed on the pixel electrode PE, and a liquid crystal layer LC disposed between the pixel electrode PE and the common electrode CE. The liquid crystal layer LC may serve as a dielectric.

The first substrate SUB1 may include a first base substrate BS1 and a transistor TR disposed on the first base substrate BS1. The first base substrate BS1 may include a pixel region PA and a non-pixel region NPA around the pixel region PA. The transistor TR may be disposed on the non-pixel region NPA. The first base substrate BS1 may include a transparent glass substrate. However, the embodiment is not limited thereto, and the first base substrate BS1 may include a transparent plastic substrate.

A gate electrode of the transistor TR may be disposed on the first base substrate BS1. A first insulating layer INS1 may be disposed on the first base substrate BS1 to cover a gate electrode GE. The first insulating layer INS1 includes an inorganic material and may be defined as a gate insulating layer.

A semiconductor layer SM of the transistor TR may be disposed on the first insulating layer INS1 that covers the gate electrode GE. Although not illustrated, the semiconductor layer SM may include an active layer and an ohmic contact layer.

A source electrode SE and a drain electrode DE of the transistor TR may be disposed to be spaced apart from each other on the semiconductor layer SM and the first insulating layer INS1 adjacent to the semiconductor layer SM. The semiconductor layer SM may form a conductive channel between the source electrode SE and the drain electrode DE.

A second insulating layer INS2 may be disposed on the first insulating layer INS1 to cover the transistor TR. The second insulating layer INS2 may include an inorganic material and may be defined as a passivation layer. The second insulating layer INS2 may cover a portion of the semiconductor layer SM that is exposed upward between the source electrode SE and the drain electrode DE.

A color filter CF may be disposed on the second insulating layer INS2. The color filter CF may provide color to light that is transmitted through the pixel PX. The color filter CF may include one of a red color filter, a green color filer, and a blue color filter.

A contact hole CH may be defined in the color filter CF and the second insulating layer INS2. The contact hole CH may overlap the non-pixel region NPA adjacent to the pixel region PA. The contact hole CH may be defined through the color filter CF and the second insulating layer INS2, and may expose a predetermined region of the drain electrode DE.

The pixel electrode PE may be disposed on the color filter CF. The pixel electrode PE may overlap the pixel region PA and extend toward the transistor TR. The pixel electrode PE may be electrically connected to the drain electrode DE of the transistor TR via the contact hole CH.

The pixel electrode PE may include a transparent conductive material. In an embodiment, the pixel electrode PE may include at least one selected from transparent conductive materials such as indium tin oxide ("ITO"), indium zinc oxide ("IZO"), and indium tin zinc oxide ("ITZO"), for example. Although not illustrated, an alignment layer may be disposed on the color filter CF to cover the pixel electrode PE.

The second substrate SUB2 may include a second base substrate BS2, a black matrix BM, a third insulating layer INS3, and a common electrode CE. The black matrix BM, the third insulating layer INS3, and the common electrode CE may be disposed below the second base substrate BS2. The second base substrate BS2 may face the first base substrate BS1 and have the same material as the first base substrate BS1.

The black matrix BM may overlap the non-pixel region NPA and may be disposed below the second base substrate BS2. The black matrix BM may have black color and block the light undesired in producing an image. The black matrix BM may prevent light leakage due to abnormal behaviors of liquid crystal molecules occurring a rim of the pixel region PA or prevent color mixing occurring between the pixel regions PA.

The third insulating layer INS3 may be disposed below the second base substrate BS2 to cover the black matrix BM. The common electrode CE may be disposed below the third insulating layer INS3. The common electrode CE may include a transparent conductive material. In an embodiment, the common electrode CE may include at least one selected from transparent conductive materials such as ITO, IZO, and ITZO, for example. Although not illustrated, an alignment layer may be disposed below the common electrode CE.

Figure 6:
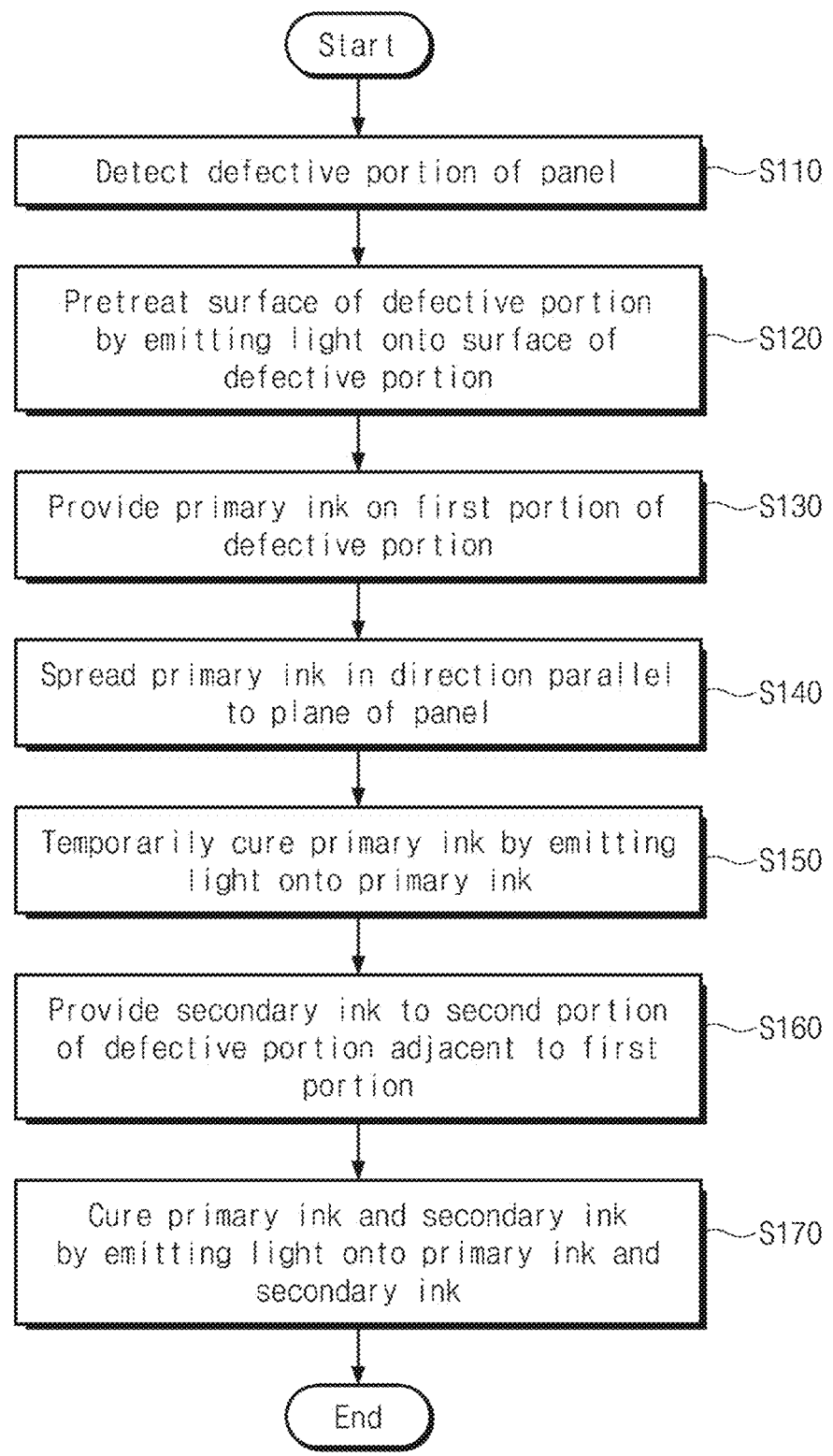
FIG. 6 is a flowchart for explaining a panel repairing method according to an embodiment of the invention.

FIG. 6 is a flowchart for explaining a panel repairing method according to an embodiment of the invention.

Referring to FIG. 6, a defective portion of the panel DP may be repaired by using the panel repairing apparatus PRA illustrated in FIG. 1. For example, in an operation (S110), the defective portion of the panel DP may be detected by using the defect detection unit DET. At least one or more defective portions may be formed in the panel DP.

In an operation (S120), the surface of the defective portion may be pretreated by emitting light to the surface of the defective portion. This process may be defined as a surface pretreatment. Through this pretreatment process, the surface of the defective portion may have a lyophilic property. In an operation (S130), primary ink may be provided in a first portion of the defective portion. The position of the first portion of the defective portion will be described later in detail.

After the primary ink is provided in the first portion, the primary ink may be spread in a direction parallel to a plane defined on the panel DP in an operation (S140). The ink ejection pin PIN illustrated in FIG. 1 may be used to spread the primary ink, and the operation of the ink ejection pin PIN to spread the primary ink will be described later in detail.

In an operation (S150), light may be emitted to the primary ink disposed in the defective portion, and thus, the primary ink may be temporarily cured. The temporary curing may be defined as a process of curing ink to a level before the ink is completely solidified.

In an operation (S160), secondary ink may be provided to a second portion of the defective portion adjacent to the first portion. In an operation (S170), light may be emitted to the primary ink and the secondary ink disposed in the defective portion, and thus, the primary ink and the secondary ink may be cured.

Hereinafter, the panel repairing method will be described in more detail with reference to FIGS. 7 to 20, and FIG. 6 will be descried together.

Figure 7:
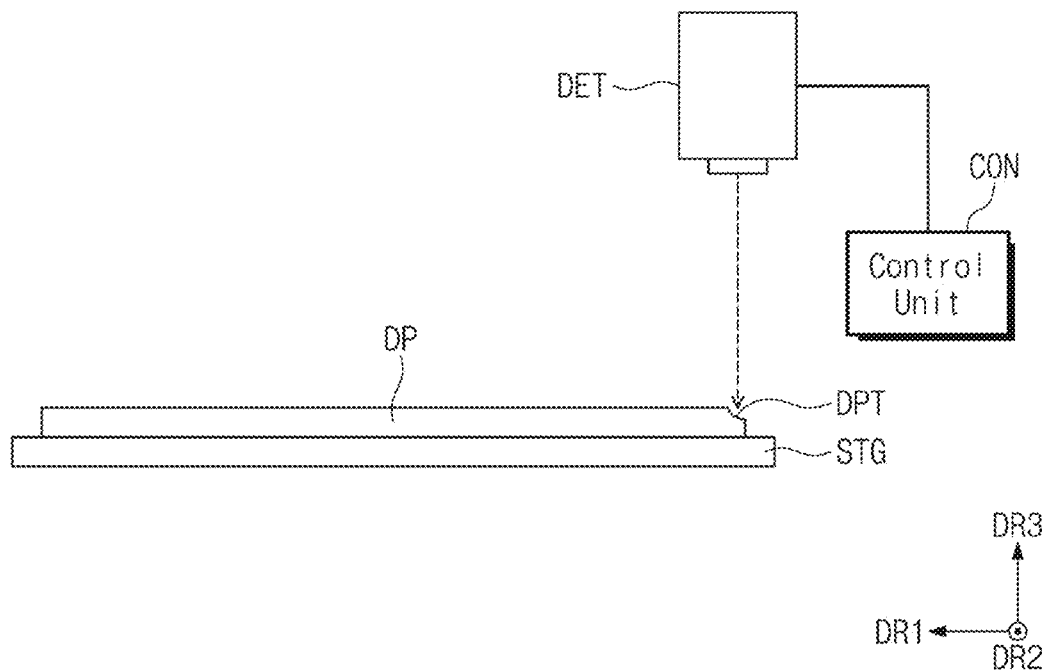
FIG. 7 is a view for explaining an operation of detecting a panel defect in the panel repairing apparatus illustrated in FIG. 1.
Figure 8:
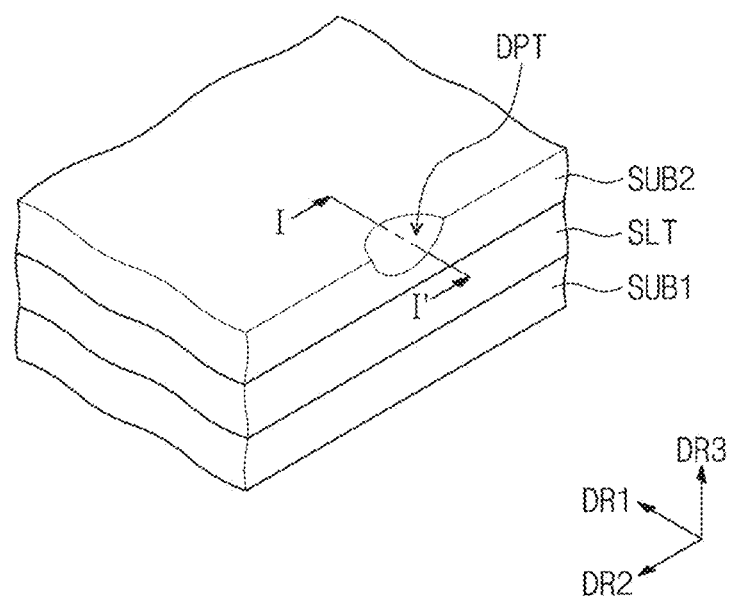
FIG. 8 is an enlarged perspective view of a defective portion illustrated in FIG. 7.

FIG. 7 is a view for explaining an operation of detecting a panel defect in the panel repairing apparatus illustrated in FIG. 1. FIG. 8 is an enlarged perspective view of a defective portion illustrated in FIG. 7.

Referring to FIGS. 6 and 7, in the operation (S110), the panel DP is disposed on the stage STG, and then, the defect detection unit DET may detect a defective portion DPT formed in the panel DP by control of the control unit CON.

As described above, the defective portion DPT may be defined as a recessed portion formed at the edge of the panel DP. The defect detection unit DET may detect the position of the defective portion DPT and transmit the position information about the defective portion DPT to the control unit CON.

Referring to FIG. 8, when a cutting process is performed, the defective portion DPT may be defined at the edge of the second substrate SUB2. In an embodiment, the defective portion DPT may be defined at the edge of the upper surface of the second substrate SUB2. When the cutting process is performed, a piece of the edge of the upper surface of the second substrate SUB2 may come out in the form of a segment, and thus, the defective portion DPT may be formed at the edge of the upper surface of the second substrate SUB2. However, the embodiment is not limited thereto, and the defective portion DPT may be defined at the edge of the first substrate SUB1.

In FIG. 7, for convenience of illustration, one defective portion DPT formed in the second substrate SUB2 is shown. However, two or more defective portions DPT may be formed at the edges of the first and second substrates SUB1 and SUB2. The defective portions DPT may be substantially formed at the edges of the first and second base substrates BS1 and BS2.

Figure 9:
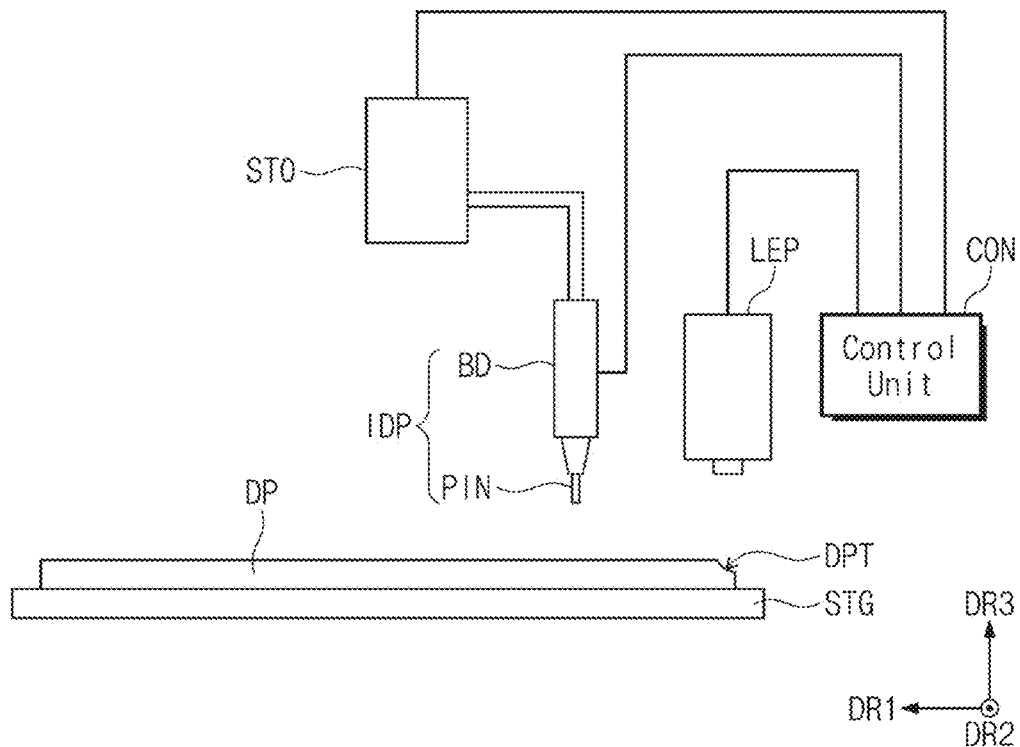
FIGS. 9 and 10 are views for explaining an operation of surface pretreatment in the panel repairing apparatus illustrated in FIG. 1.
Figure 10:
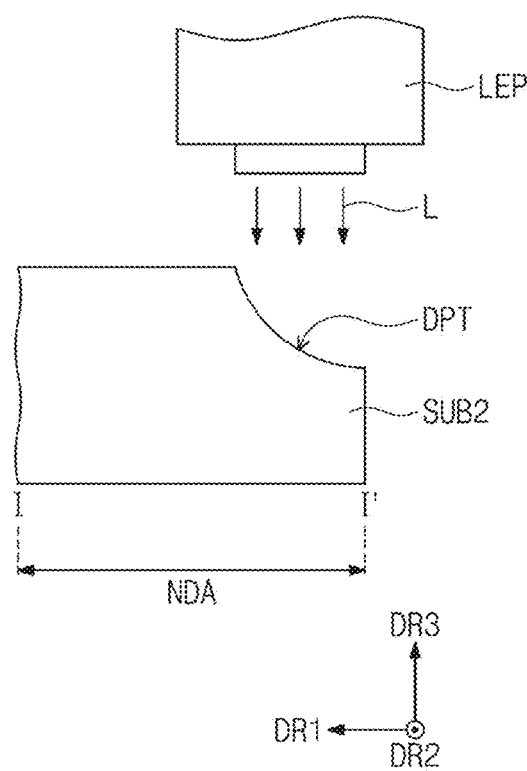

FIGS. 9 and 10 are views for explaining an operation of surface pretreatment in the panel repairing apparatus illustrated in FIG. 1.

FIG. 10 is a cross-sectional view of the second substrate SUB2 taken along line I-I' of FIG. 8. Hereinafter, the cross-section of the second substrate SUB2 corresponding to FIG. 10 is shown in each of FIG. 12, FIG. 13, and FIGS. 16 to 20.

Referring to FIGS. 6, 9, and 10, the defective portion DPT may be formed in the non-display region NDA. In the operation (S120), the control unit CON may move the light radiation unit LEP above the defective portion DPT according to the position information about the defective portion DPT received from the defect detection unit DET. The light radiation unit LEP may emit light L to the defective portion DPT to pretreat the surface of the defective portion DPT. The light L generated in the light radiation unit LEP may be ultraviolet light.

When ultraviolet light L is provided to the surface of the defective portion DPT, the surface of the defective portion DPT may be modified to be lyophilic. The surface of the defective portion DPT pretreated by the light L has a lyophilic property, and thus, the ink may be well adsorbed to the defective portion DPT. The principle of surface modification according to the ultraviolet light L is as follows.

When electrons or ions having high energy like the ultraviolet light L collie with a glass substrate or a plastic substrate, radicals or ions may be generated due to these collisions. As ozone, oxygen, nitrogen, moisture, and the like near the radicals or ions react with carbon, hydrogen, and the like on the surface of the substrate, highly polar functional groups such as a carbonyl group, a carboxyl group, a hydroxyl group, a cyan group, and the like may be generated. As a result, the surface of the substrate may be chemically modified to be hydrophilic (that is, lyophilic).

The light radiation unit LEP may generate light for a first period of time. The first period of time may be set to about 5 seconds to about 10 seconds. The light radiation unit LEP may provide the light L to the defective portion DPT three times to sufficiently pretreat the surface of the defective portion DPT. That is, the total radiation time of the light L emitted to the surface of the defective portion DPT may be about 15 seconds to about 30 seconds. However, the embodiment is not limited thereto, and the light L may be provided to the defective portion DPT three times or more.

Figure 11:
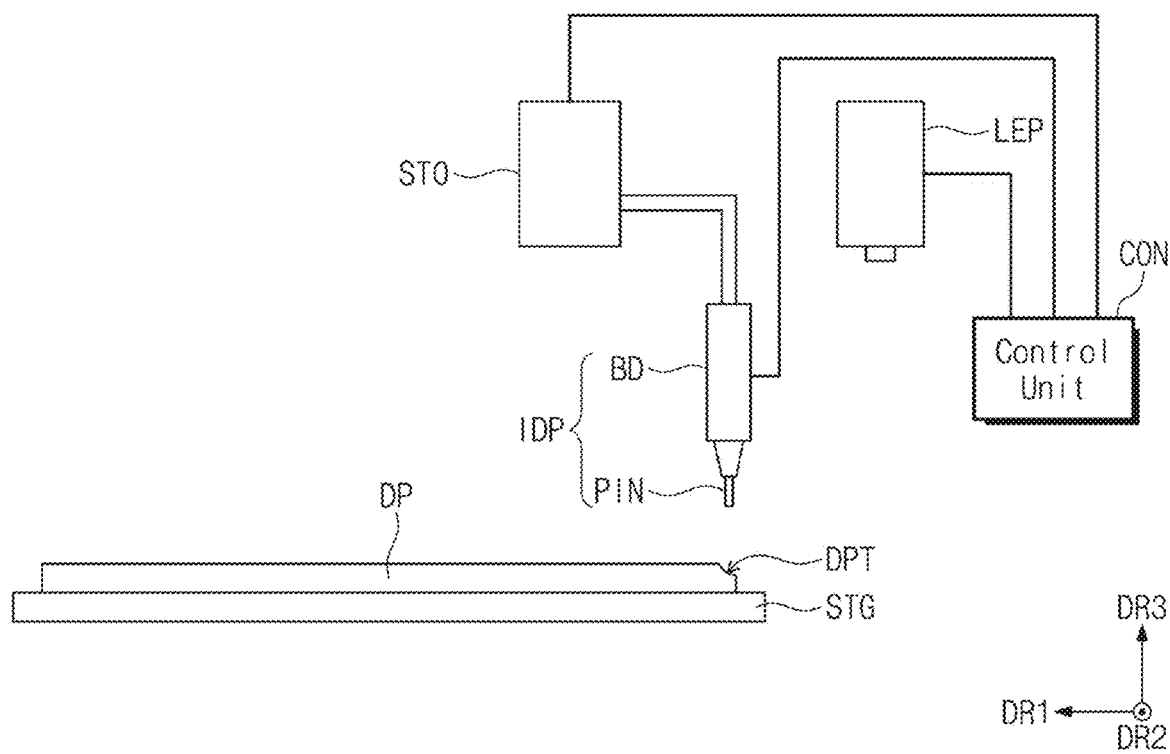
FIGS. 11, 12, and 13 are views for explaining an operation of ejecting primary ink in the panel repairing apparatus illustrated in FIG. 1.
Figure 12:
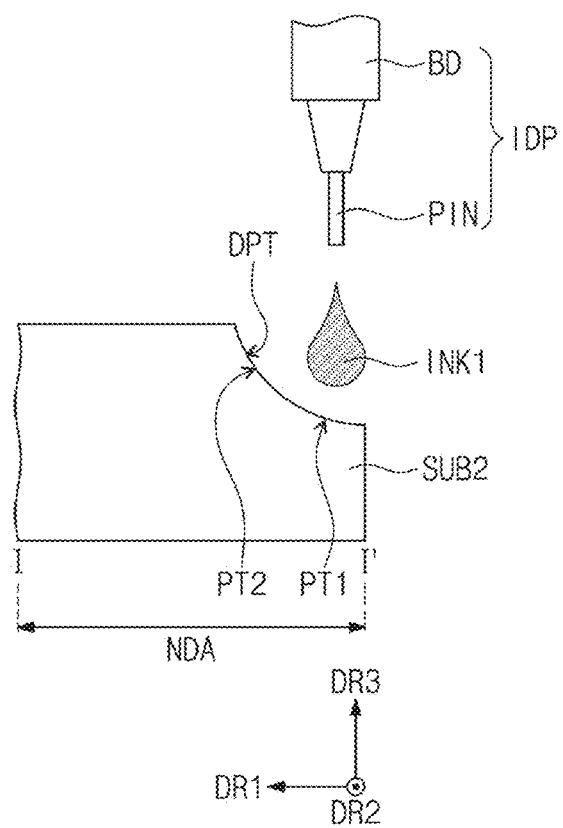
Figure 13:
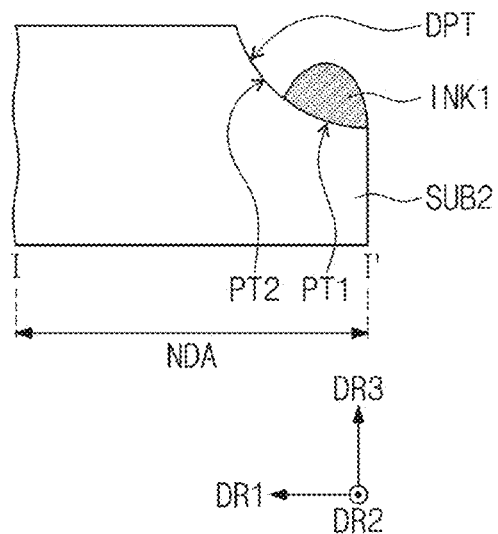

FIGS. 11, 12, and 13 are views for explaining an operation of ejecting primary ink in the panel repairing apparatus illustrated in FIG. 1.

Referring to FIGS. 6, 11, 12, and 13, in the operation (S130), the control unit CON may move the ink ejection unit IDP above the defective portion DPT according to the position information about the defective portion DPT received from the defect detection unit DET.

The ink stored in the ink storage unit STO may be provided to the ink ejection unit IDP, and the ink ejection unit IDP may eject primary ink INK1 and provide the primary ink INK1 to the defective portion DPT. In an embodiment, the primary ink INK1 ejected from the ink ejection pin PIN may be provided to the surface of the defective portion DPT.

The defective portion DPT may include a first portion PT1 and a second portion PT2 disposed near the first portion PT1. The first portion PT1 may be defined in a lower region of the defective portion DPT, and the second portion PT2 may be defined in a region of the defective portion DPT disposed above the first portion PT1. The primary ink INK1 ejected from the ink ejection pin PIN may be provided on the first portion PT1.

Figure 14:
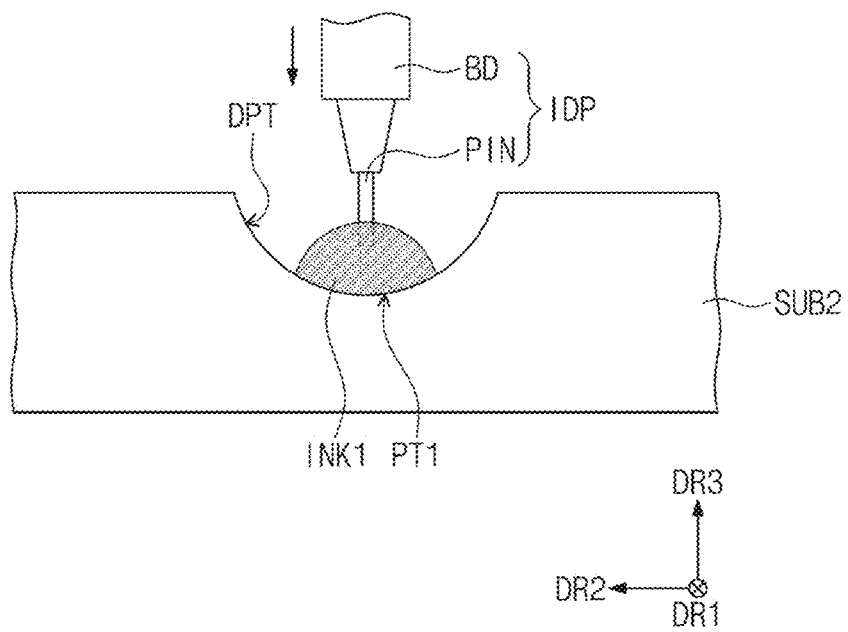
FIGS. 14 and 15 are views for explaining an operation of spreading the primary ink in the panel repairing apparatus illustrated in FIG. 1.
Figure 15:
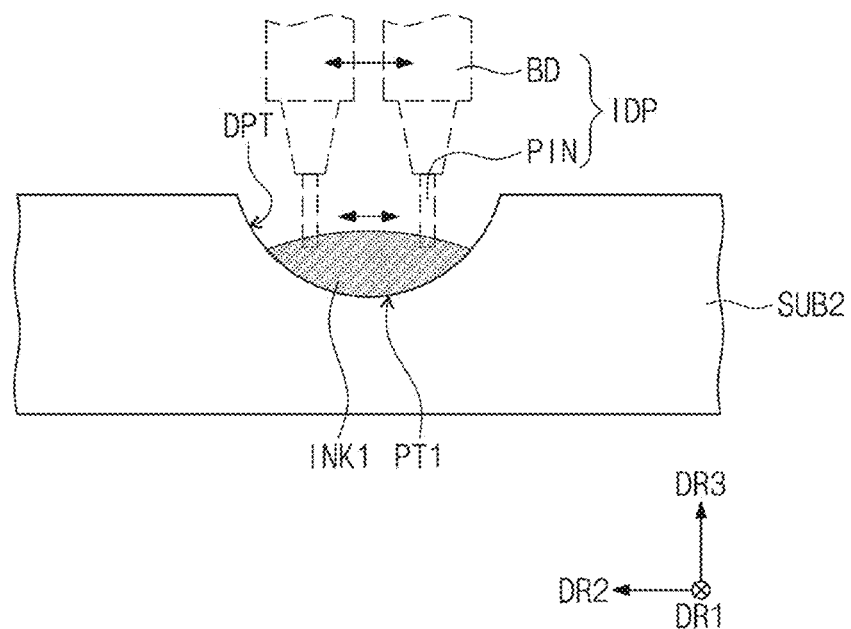

FIGS. 14 and 15 are views for explaining an operation of spreading the primary ink in the panel repairing apparatus illustrated in FIG. 1.

For instance, FIGS. 14 and 15 illustrate side views of the defective portion DPT when viewed in the first direction DR1.

Referring to FIGS. 6, 14, and 15, the first portion PT1 may be disposed at a central region of the lower portion of the defective portion DPT. The primary ink INK1 is provided in the first portion PT1, and in the operation (S140), the primary ink INK1 may be spread in the second direction DR2 by the ink ejection pin PIN. The second direction DR2 may be defined as a direction parallel to the plane defined on the panel DP.

Specifically, referring to FIG. 14, the ink ejection unit IDP may move downward, and the ink ejection pin PIN may come into contact with the primary ink INK1. The control unit CON may move the ink ejection pin PIN downward in a way such that the ink ejection pin PIN comes into contact with the primary ink INK1. The lower portion of the ink ejection pin PIN may be disposed within the primary ink INK1.

Referring to FIG. 15, the control unit CON may reciprocate the ink ejection pin PIN in the second direction DR2. As the ink ejection pin PIN reciprocates in the second direction DR2, the primary ink INK1 may be spread in the second direction DR2. Thus, the primary ink INK1 may be disposed more uniformly in the lower portion of the defective portion DPT.

Figure 16:
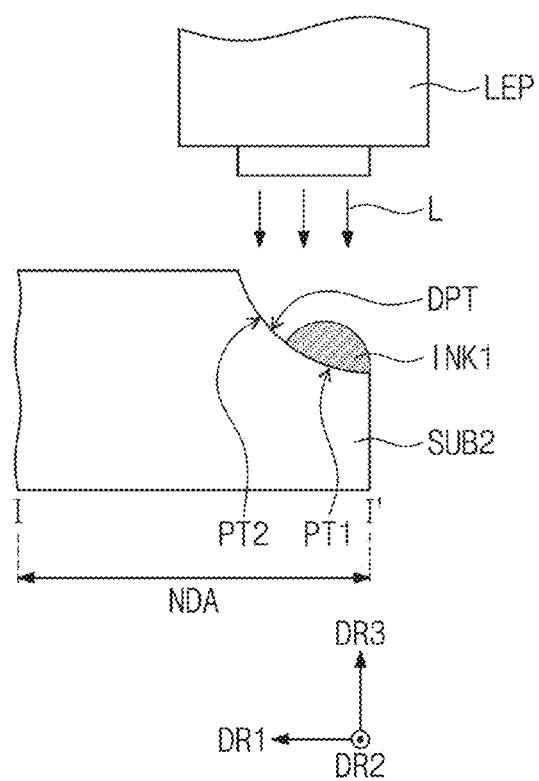
FIG. 16 is a view for explaining an operation of temporarily curing the primary ink in the panel repairing apparatus illustrated in FIG. 1.

FIG. 16 is a view for explaining an operation of temporarily curing the primary ink in the panel repairing apparatus illustrated in FIG. 1.

Referring to FIGS. 6 and 16, in the process (S150), the control unit CON may move the light radiation unit LEP above the defective portion DPT. The light radiation unit LEP may emit light L to the primary ink INK1. The primary ink INK1 may be temporarily cure by the light L. The light L may be emitted to the primary ink INK1 one time to temporarily cure the primary ink INK1. That is, the light L may be emitted to the primary ink INK1 for about 5 seconds to about 10 seconds.

Figure 17:
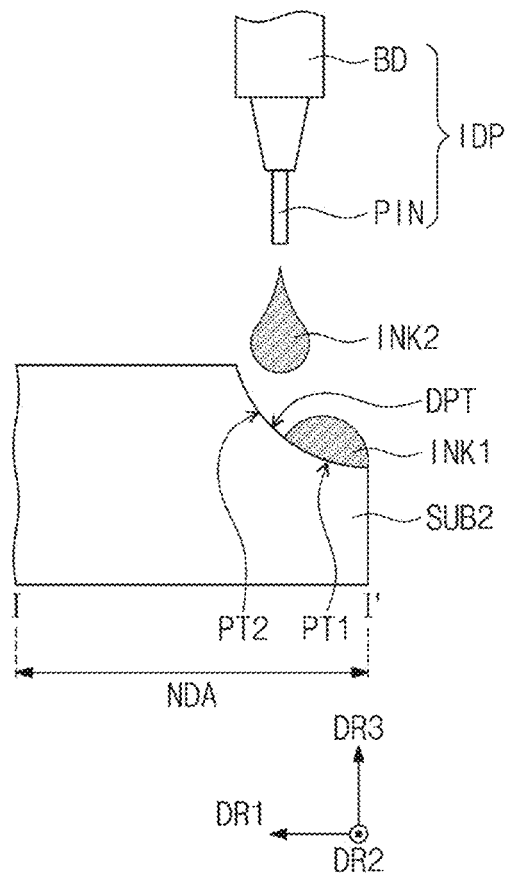
FIGS. 17 and 18 are views for explaining an operation of ejecting secondary ink in the panel repairing apparatus illustrated in FIG. 1.
Figure 18:
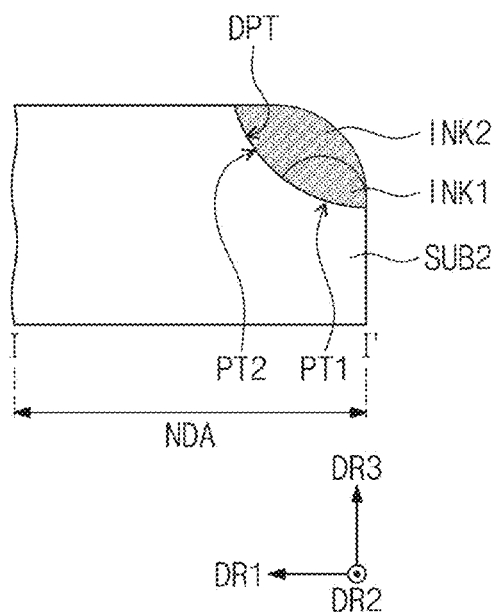

FIGS. 17 and 18 are views for explaining an operation of ejecting secondary ink in the panel repairing apparatus illustrated in FIG. 1.

Referring to FIGS. 6, 17, and 18, in the process (S160), the control unit CON may move the ink ejection unit IDP above the defective portion DPT. The ink ejection unit IDP may eject secondary ink INK2 and provide the secondary ink INK2 to the defective portion DPT. The secondary ink INK2 ejected from the ink ejection pin PIN may be provided on the second portion PT2. That is, the primary ink INK1 and the secondary ink INK2 may be respectively provided to different regions of the defective portion DPT.

The primary ink INK1 provided on the first portion PT1 may serve as a dam. The primary ink INK1 may not be provided in the first portion PT1, but instead, ink having the total amount of the primary and secondary inks INK1 and INK2 may be provided to the defective portion DPT at one time. In this case, the ink may flow down along the side surface of the second substrate SUB2 below the defective portion DPT.

However, in the embodiment of the invention, a predetermined amount of the primary ink INK1 is provided first on the first portion PT1 and temporarily cured. Subsequently, the secondary ink INK2 may be provided on the second portion PT2. In such an embodiment, the primary ink INK1 disposed earlier may serve as a dam to prevent the secondary ink INK2 from flowing down along the side surface of the second substrate SUB2.

The primary and secondary inks INK1 and INK2 may be provided to the first and second portions PT1 and PT2, and thus, the defective portion DPT may be filled with the primary and secondary inks INK1 and INK2.

Figure 19:
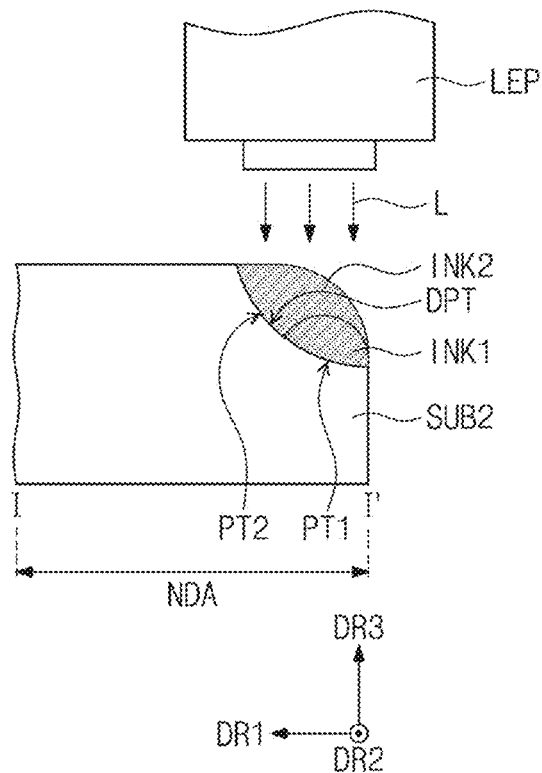
FIG. 19 is a view for explaining an operation of curing the primary and secondary inks in the panel repairing apparatus illustrated in FIG. 1.

FIG. 19 is a view for explaining an operation of curing the primary and secondary inks in the panel repairing apparatus illustrated in FIG. 1.

Referring to FIGS. 6 and 19, in the process (S170), the control unit CON may move the light radiation unit LEP above the defective portion DPT. The light radiation unit LEP may emit light L to the primary and secondary inks INK1 and INK2 disposed in the defective portion DPT. The primary and secondary inks INK1 and INK2 may be cured by the light L.

The light radiation unit LEP may emit the light L to the primary and secondary inks INK1 and INK2 three times to sufficiently cure the primary and secondary inks INK1 and INK2. That is, the total radiation time of light L emitted to the primary and secondary inks INK1 and INK2 may be about 15 seconds to about 30 seconds. However, the embodiment is not limited thereto, and the light L may be provided to the primary and secondary inks INK1 and INK2 three times or more.

As described above, in an embodiment, the light L may include ultraviolet light, but the type of light may be limited thereto. In an alternative embodiment, various other types of light capable of performing the pretreatment described above and curing the primary and secondary inks INK1 and INK2 may be generated in the light radiation unit LEP.

Figure 20:
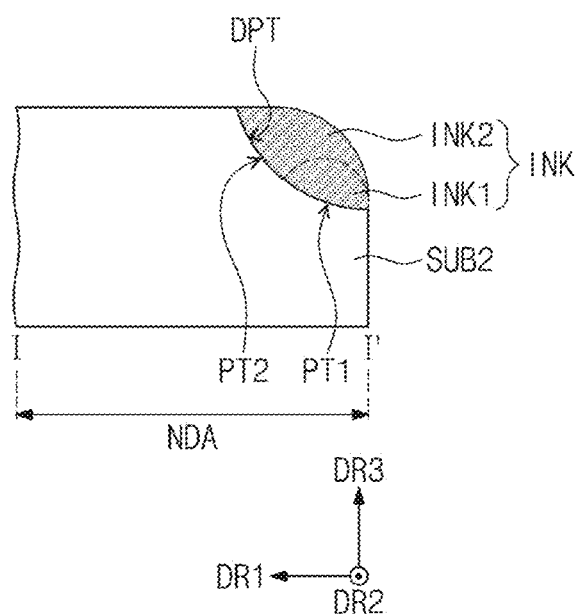
FIG. 20 is a view illustrating a defective portion repaired by the primary and secondary inks illustrated in FIG. 19.

FIG. 20 is a view illustrating a defective portion repaired by the primary and secondary inks illustrated in FIG. 19.

Referring to FIG. 20, the cured ink INK may be disposed on the defective portion DPT, and thus, the second substrate SUB2 may be repaired. As a result, the panel DP may be repaired. The ink INK may include the cured primary ink INK1 and the cured secondary ink INK2.

The primary ink INK1 and the secondary ink INK2 may have the same color as the non-display region NDA. In an embodiment, the black matrix BM illustrated in FIG. 5 may be disposed overlapping the non-display region NDA. In such an embodiment, the primary ink INK1 and the secondary ink INK2 may include black color. Thus, the defective portion DPT may be prevented from being seen. The primary ink INK1 and the secondary ink INK2 may include an acrylic-based or imide-based polymer material having black color.

The method for repairing the defective portion DPT formed in the second substrate SUB2 has been described, but the embodiment is not limited thereto. In an embodiment, the panel repairing apparatus PRA may repair a defective portion DPT formed in the first substrate SUB1. In such an embodiment, the first substrate SUB1 is disposed above the second substrate SUB2, and the defective portion DPT of the first substrate SUB1 may be repaired.

Figure 21:
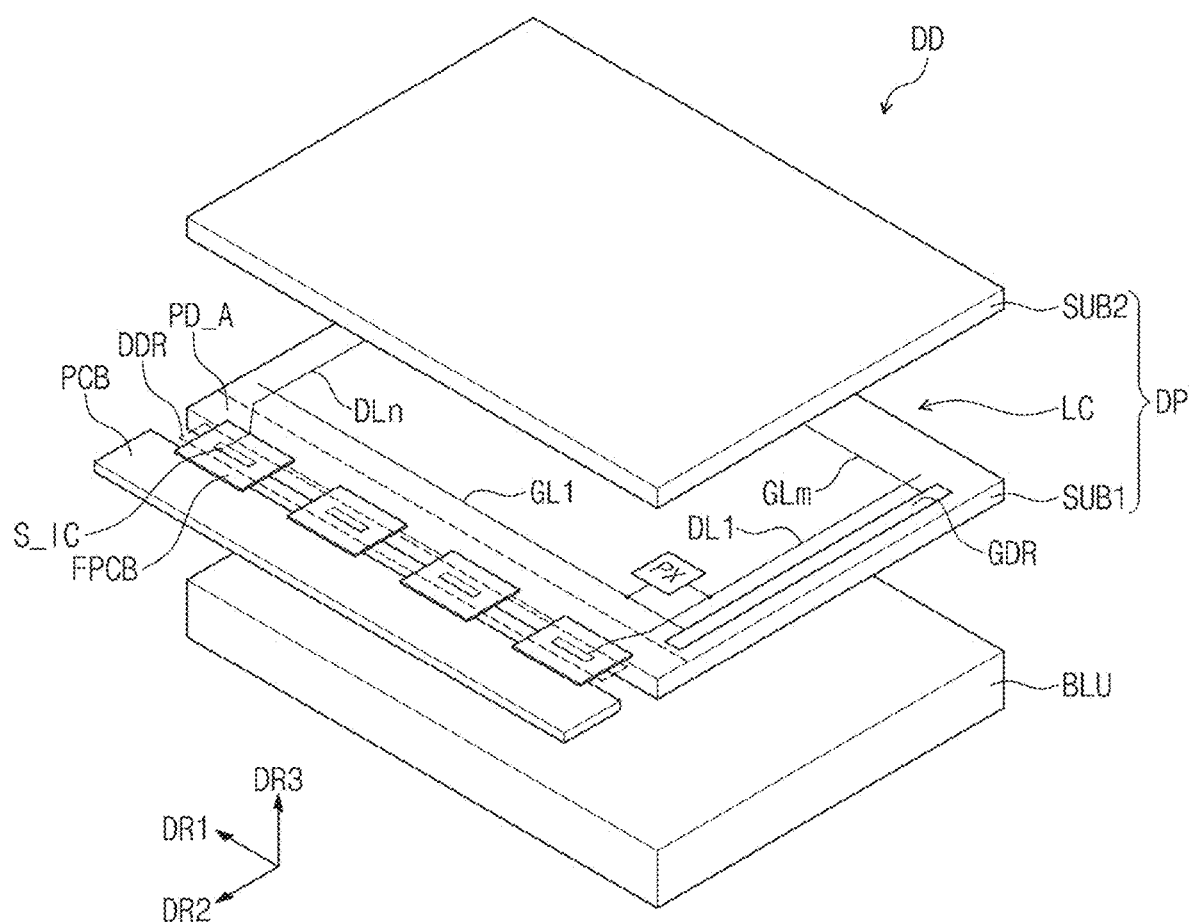
FIG. 21 is an exploded perspective view of an embodiment of a display device which is manufactured by using the panel repaired by the panel repairing apparatus illustrated in FIG. 1.

FIG. 21 is an exploded perspective view of an embodiment of a display device which is manufactured by using the panel repaired by the panel repairing apparatus illustrated in FIG. 1.

In FIG. 21, a panel DP may be defined as a display panel DP for displaying an image.

Referring to FIG. 21, an embodiment of a display device DD may include a display panel DP, a gate driver GDR, a data driver DDR, a printed circuit board PCB, and a backlight unit BLU.

The backlight unit BLU may generate light and provide the generated light to the display panel DP. The backlight unit BLU may be an edge-type backlight unit or a direct-type backlight unit. The display panel DP may generate an image by using the light provided from the backlight unit BLU. The generated image may be provided to a user through an upper portion of the display panel DP.

The display panel DP may include a first substrate SUB1, a second substrate SUB2, and a liquid crystal layer LC. A plurality of pixels PX, a plurality of gate lines GL1 to GLm, and a plurality of data lines DL1 to DLn may be arranged in the first substrate SUB1. Here, m and n are natural numbers. For convenience of illustration, FIG. 21 illustrates only one pixel PX, but substantially, the plurality of pixels PX may be disposed in the first substrate SUB1.

The gate lines GL1 to GLm and the data lines DL1 to DLn may be insulated from each other while crossing each other. The gate lines GL1 to GLm may extend in the first direction DR1 and may be connected to the gate driver GDR. The data lines DL1 to DLn may extend in the second direction DR2 and may be connected to the data driver DDR. The pixels PX may be connected to the gate lines GL1 to GLm and the data lines DL1 to DLn.

The gate driver GDR may be disposed in a predetermined region of the first substrate SUB1 adjacent to one of the short sides of the first substrate SUB1. The gate driver GDR may be formed simultaneously through the same process as transistors of the pixels PX, and may be disposed on the first substrate SUB1 in the form of an amorphous silicon TFT gate driver circuit ("ASG") or an oxide silicon TFT gate driver circuit ("OSG").

However, the embodiment is not limited thereto. The gate driver GDR may be formed in the form of a plurality of driving chips and mounted to flexible printed circuit boards, and may be connected to the first substrate SUB1 via the flexible printed circuit boards. Alternatively, the gate driver GDR may be formed in the form of a plurality of driving chips and mounted to the first substrate SUB1 in manner of chip on glass ("COG").

The data driver DDR may include at least one source driving chip S_IC disposed on at least one flexible circuit board FPCB. FIG. 21 illustrates an embodiment including four source driving chips S_IC and four flexible circuit boards FPCB, but the numbers of the source driving chips S_IC and the flexible circuit boards FPCB are not limited thereto according to the size of the display panel DP.

The source driving chips S_IC may be mounted to the flexible circuit boards FPCB, and the sides of the flexible circuit boards FPCB may be connected to a region of the display panel DP adjacent to one side of the display panel DP. The one side of the display panel DP may be defined as one of the long sides of the display panel DP. The sides of the flexible circuit boards FPCB may be connected to a pad region PD_A adjacent to the one side of the display panel DP. The other sides of the flexible circuit boards FPCB may be connected to the printed circuit board PCB.

The source driving chips S-IC may be connected to the first substrate SUB1 and the printed circuit board PCB via the flexible circuit boards FPCB. This connection method may be defined as a tape carrier package ("TCP") manner.

A timing controller (not shown) may be disposed on the printed circuit board PCB. The timing controller may be mounted to the printed circuit board PCB in the form of an integrated circuit chip and connected to the gate driver GDR and the data driver DDR via the flexible circuit boards FPCB. The timing controller may output a gate control signal, a data control signal, and image data.

The gate driver GDR may receive the gate control signal from the timing controller and generate a plurality of gate signals in response to the gate control signal. The gate driver GDR may sequentially output the gate signals. The gate signals may be provided, on a row-by-row basis, to the pixels PX via the gate lines GL1 to GLm. As a result, the pixels PX may be driven on a row-by-row basis.

The data driver DDR may receive image data and data control signal from the timing controller. In response to the data control signal, the data driver DDR may generate and output data voltages in the form of analog corresponding to the image data. The data voltages may be provided to the pixels PX via the data lines DL1 to DLn.

In response to gate signals provided via the gate lines GL1 to GLm, the pixels PX may receive the data voltages via the data lines DL1 to DLn. The pixels PX may display gray scales corresponding to the data voltages, and thus, the image is displayed.

Figure 22:
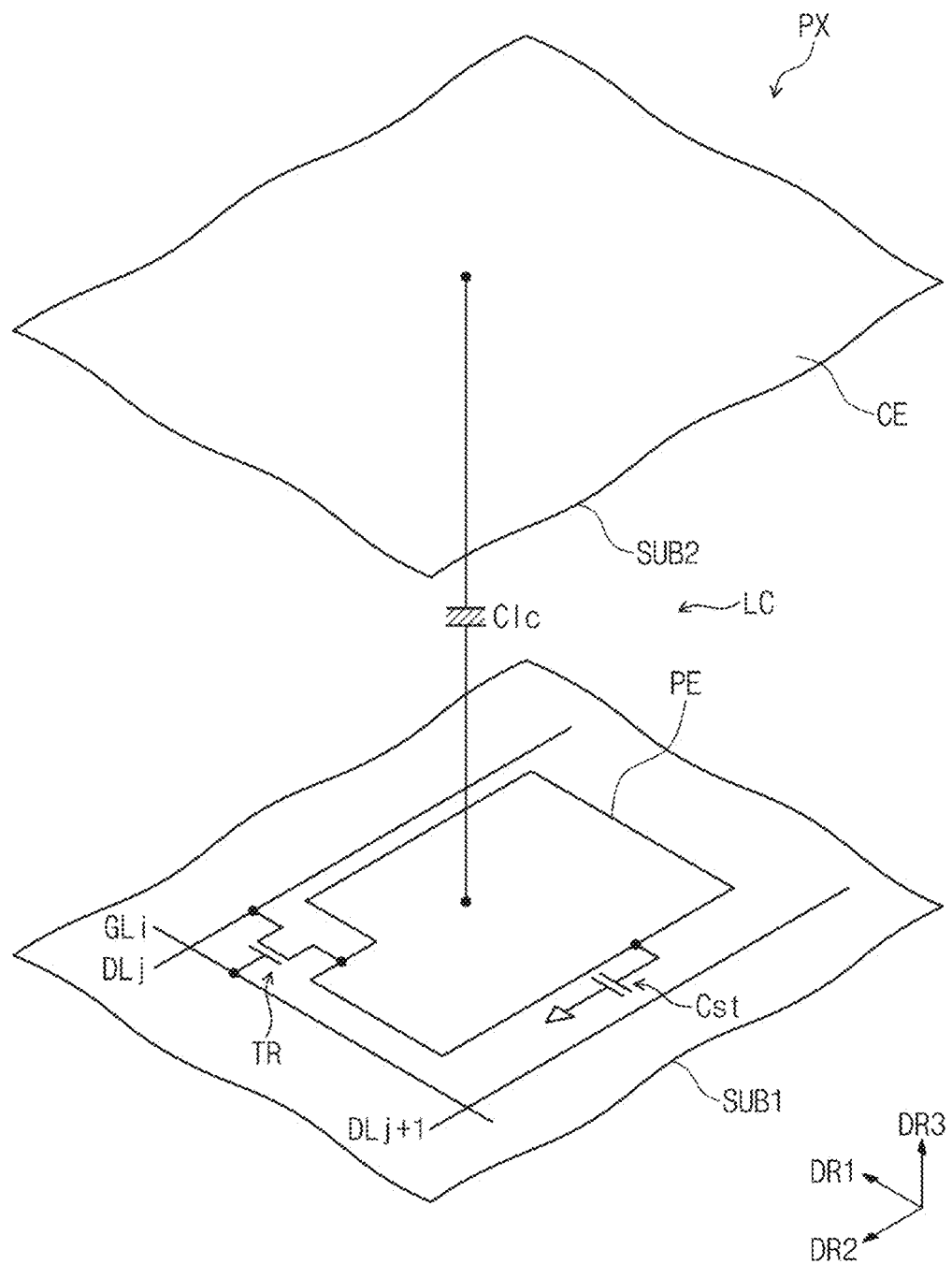
FIG. 22 is a view showing a configuration of the pixel illustrated in FIG. 21.

FIG. 22 is a view showing a configuration of the pixel illustrated in FIG. 21.

For instance, FIG. 22 illustrates a pixel PX connected to a gate line GL1 and a data line DLj.

Referring to FIG. 22, the pixel PX may include a transistor TR connected to the gate line GL1 and the data line DLj, a liquid crystal capacitor Clc connected to the transistor TR, and a storage capacitor Cst connected in parallel to the liquid crystal capacitor Clc. The storage capacitor Cst may be omitted. Here, i and j are natural numbers.

The transistor TR disposed on the first substrate SUB1 may include a gate electrode connected to the gate line GL1, a source electrode connected to the data line DLj, and a drain electrode connected to the liquid crystal capacitor Clc and the storage capacitor Cst. The gate electrode, the source electrode, and the drain electrode may be the gate electrode GE, the source electrode SE, and the drain electrode DE which are illustrated in FIG. 5.

The structure of the liquid crystal capacitor Clc has been described in detail in FIG. 5, and thus, the description thereof will be omitted.

In FIG. 22, a pixel electrode PE has a non-slit structure, but the embodiment is not limited thereto. Alternatively, the pixel electrode PE may have a slit structure that includes a stem portion having a cross shape and a plurality of branch portions extending radially from the stem portion.

The common electrode CE described above is disposed on the second substrate SUB2, but the embodiment is not limited thereto. Alternatively, the common electrode CE may be disposed on the first substrate SUB1. In such an embodiment, at least one of the pixel electrode PE and the common electrode CE may have a slit.

The storage capacitor Cst may include the pixel electrode PE, a storage electrode (not shown) branched from a storage line (not shown), and an insulating layer disposed between the pixel electrode PE and the storage electrode. The storage line may be disposed on the first substrate SUB1 and may be simultaneously formed in the same layer as the gate lines GL1 to GLm. The storage electrode may partially overlap the pixel electrode PE.

The transistor TR is turned on in response to the gate signal provided via the gate line GL1. The data voltage received via the data line DLj may be provided to the pixel electrode PE of the liquid crystal capacitor Clc via the turned-on transistor TR. The common voltage may be applied to the common electrode CE.

An electric field may be formed between the pixel electrode PE and the common electrode CE due to a difference in voltage level between the data voltage and the common voltage. The liquid crystal molecules of the liquid crystal layer LC may be driven by the electric field formed between the pixel electrode PE and the common electrode CE. The light transmittance may be adjusted by the liquid crystal molecules driven by the electric field, and an image may be displayed.

A storage voltage having a uniform voltage level may be applied to the storage line. However, the embodiment is not limited thereto, and the common voltage may be applied to the storage line. The storage capacitor Cst may serve to compensate a charge amount of the liquid crystal capacitor Clc.

FIGS. 23 to 28 are views illustrating an embodiment of a method for repairing a defect of a color filter of a first substrate by using the panel repairing apparatus illustrated in FIG. 1.

FIGS. 23 to 28 illustrate cross-sections corresponding to FIG. 5. Hereinafter, FIGS. 1 and 5 will be described together.

Figure 23:
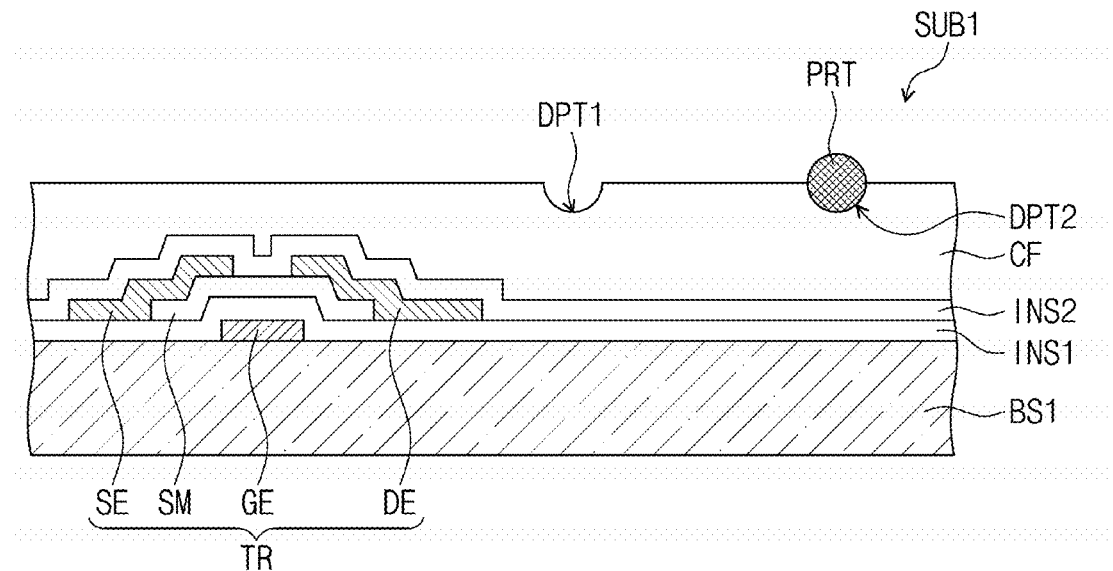
FIGS. 23 to 28 are views illustrating an embodiment of a method for repairing a defect of a color filter of a first substrate by using the panel repairing apparatus illustrated in FIG. 1.
Figure 24:
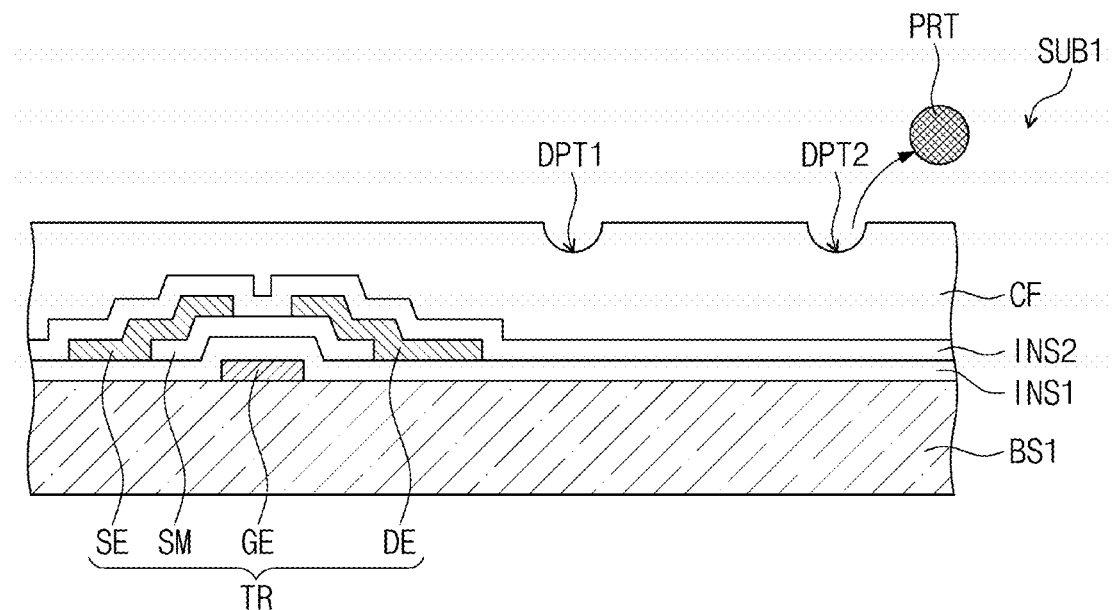

Referring to FIGS. 5, 23, and 24, when a first substrate SUB1 is manufactured, colored ink may be provided on a second insulating layer INS2 to form a color filter CF. The colored ink may be cured to manufacture the color filter CF.

When the color filter CF is manufactured, defective portions DPT1 and DPT2 may be formed in the upper surface of the color filter CF. In an embodiment, a portion of the upper surface of the color filter CF may be recessed, and a first defective portion DPT1 may be defined, for example. Also, when a pollutant particle PRT disposed in the upper surface of the color filter CF is removed, a second defective portion DPT2 having a recessed shape due to the removed pollutant particle PRT may be defined.

Figure 25:
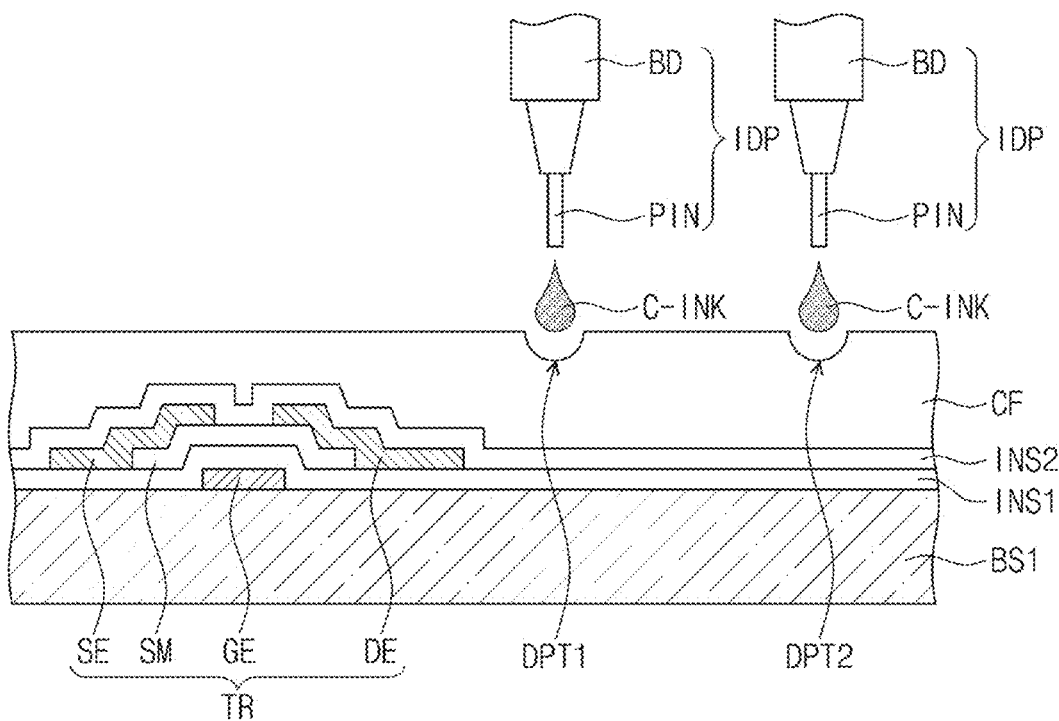

Referring to FIGS. 1 and 25, the defect detection unit DET may detect the positions of the first and second defective portions DPT1 and DPT2 and provide the positions of the first and second defective portions DPT1 and DPT2 to the control unit CON. According to the positions of the first and second defective portions DPT1 and DPT2, the control unit CON may move the ink ejection unit IDP above the first defective portion DPT1 and the second defective portion DPT2. A colored ink C-INK having the same color as the color filter CF may be stored in the ink storage unit STO.

The colored ink C-INK may be provided to the ink ejection unit IDP, and the colored ink C-INK ejected from the ink ejection pin PIN may be provided to the first and second defective portions DPT1 and DPT2. The ink ejection unit IDP may be disposed above one of the first and second defective portions DPT1 and DPT2 and eject the ink, and then, move to above the other one and eject the ink.

However, the embodiment is not limited thereto, the ink ejection unit IDP may be provided in plurality, and the plurality of ink ejection units IDP may simultaneously eject the colored ink C-INK to the first and second defective portions DPT1 and DPT2.

Figure 26:
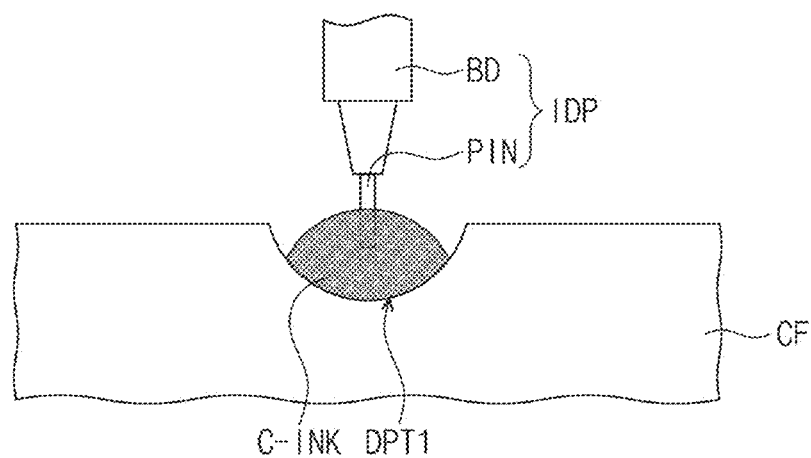
Figure 27:
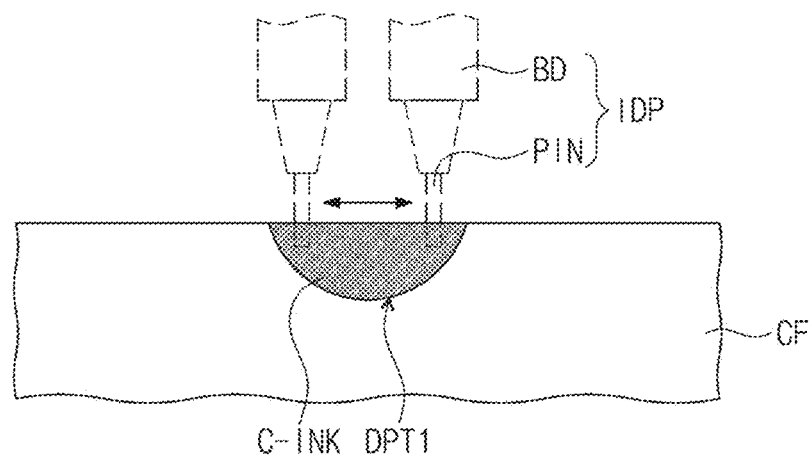

Referring to FIGS. 26 and 27, the colored ink C-INK is provided to the first defective portion DPT1, and then, the ink ejection pin PIN comes into contact with the colored ink C-INK. The ink ejection pin PIN may reciprocate in the horizontal direction by control of the control unit CON. The horizontal direction may be the first direction DR1 or the second direction DR2. This operation is substantially the same as the operation illustrated above in FIGS. 14 and 15.

According to the movement of the ink ejection pin PIN, the colored ink C-INK may be more easily spread in the horizontal direction in the first defective portion DPT1. Thus, the colored ink C-INK may be more uniformly disposed in the first defective portion DPT1.

The operation for spreading the colored ink C-INK provided in the first defective portion DPT1 has been described. However, the colored ink C-INK provided in the second defective portion DPT2 may also be more easily spread by the ink ejection pin PIN in the same manner.

Figure 28:
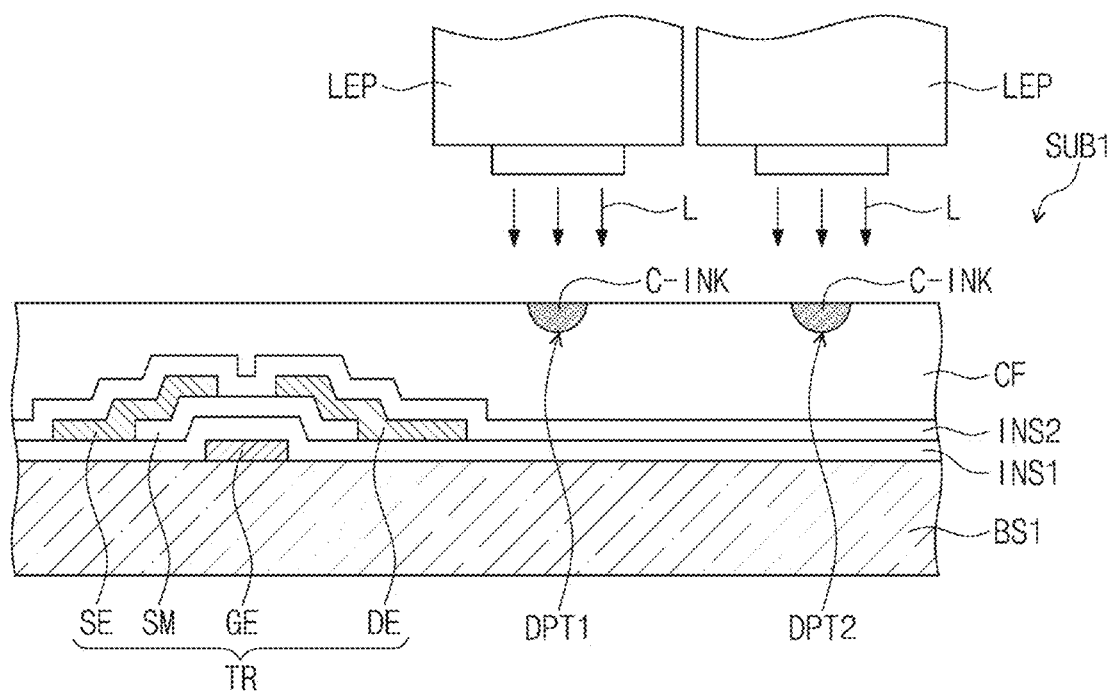

Referring to FIG. 28, the control unit CON may move the light radiation unit LEP above the first defective portion DPT1 and the second defective portion DPT2. The light radiation unit LEP may emit light L to the colored ink C-INK disposed on the first defective portion DPT1 and the second defective portion DPT2. The colored ink C-INK may be cured by the light L, and as a result, the color filter CF of the first substrate SUB1 may be repaired.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

INDUSTRIAL APPLICABILITY

A defect of a display panel may be easily repaired to increase a yield of the display panel, and thus, the invention has high industrial applicability.

The invention claimed is:
1. A panel repairing method comprising:
 detecting a defective portion of a panel;
 providing primary ink, which is ejected from an ink ejection pin, onto a first portion of the defective portion;
 spreading the primary ink in a direction parallel to a plane defined on the panel;
 temporarily curing the primary ink;

providing secondary ink, which is ejected from the ink ejection pin, onto a second portion of the defective portion disposed near the first portion; and curing the primary ink and the secondary ink; wherein the panel comprises:

a first substrate;

a second substrate disposed opposite to the first substrate; and an image display layer disposed between the first substrate and the second substrate, wherein the defective portion is formed at an edge of the first substrate or an edge of the second substrate.

2. The panel repairing method of claim 1, wherein the spreading of the primary ink comprises:

bringing the ink ejection pin into contact with the primary ink; and reciprocating the ink ejection pin in the direction parallel to the plane to spread the primary ink.

3. The panel repairing method of claim 1, wherein the temporary curing of the primary ink comprises emitting light to the primary ink to temporarily cure the primary ink.

4. The panel repairing method of claim 3, wherein the light is emitted to the primary ink one time.

5. The panel repairing method of claim 3, wherein the curing of the primary ink and the secondary ink comprises emitting the light to the primary ink and the secondary ink to cure the primary ink and the secondary ink.

6. The panel repairing method of claim 5, wherein the light is emitted to the primary ink and the secondary ink at least three times.

7. The panel repairing method of claim 3, further comprising pretreating a surface of the defective portion by emitting the light to the defective portion before providing the primary ink to the first portion.

8. The panel repairing method of claim 7, wherein the light is provided to the defective portion at least three times to pretreat the surface of the defective portion.

9. The panel repairing method of claim 3, wherein the light comprises ultraviolet light.

10. The panel repairing method of claim 1, wherein the defective portion is defined as a recessed portion at an edge of the panel.

11. The panel repairing method of claim 10, wherein the second portion is disposed above the first portion.

12. The panel repairing method of claim 10, wherein the first portion is disposed at a central region of a lower portion of the defective portion.

13. The panel repairing method of claim 1, wherein each of the primary ink and the secondary ink has a black color.

14. The panel repairing method of claim 1, wherein the primary ink and the secondary ink comprise an acrylic-based or imide-based polymer material.

15. The panel repairing method of claim 1, wherein the panel comprises a display region and a non-display region around the display region, the defective portion is disposed in the non-display region, and each of the primary ink and the secondary ink has a same color as the non-display region.

16. A panel repairing method comprising:

providing primary ink, which is ejected from an ink ejection pin, to a defective portion of a panel;

bringing the ink ejection pin into contact with the primary ink;

moving the ink ejection pin in a direction parallel to a plane defined on the panel to spread the primary ink;

temporarily curing the primary ink;

providing secondary ink, which is ejected from the ink ejection pin, to the defective portion; and curing the primary ink and the secondary ink.

17. The panel repairing method of claim 16, wherein the defective portion is defined as a recessed portion at an edge of the panel, and the primary ink and the secondary ink are respectively provided to different regions of the defective portion.

18. The panel repairing method of claim 17, wherein the defective portion comprises:

a first portion to which the primary ink is provided; and a second portion which is above the first portion and to which the secondary ink is provided.

* * * * *